(12) United States Patent
Chiu et al.

(10) Patent No.: US 11,515,232 B2
(45) Date of Patent: Nov. 29, 2022

(54) LIQUID COOLING THROUGH CONDUCTIVE INTERCONNECT

(71) Applicant: Intel Corporation, Santa Clara, CA (US)

(72) Inventors: Chia-Pin Chiu, Tempe, AZ (US);
Robert Sankman, Phoenix, AZ (US);
Pooya Tadayon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 720 days.

(21) Appl. No.: 16/379,619

(22) Filed: Apr. 9, 2019

(65) Prior Publication Data
US 2020/0328139 A1 Oct. 15, 2020

(51) Int. Cl.
| | |
|---|---|
| *H01L 23/473* | (2006.01) |
| *H05K 7/20* | (2006.01) |
| *H01L 23/373* | (2006.01) |
| *H01L 23/367* | (2006.01) |
| *H01L 23/00* | (2006.01) |

(52) U.S. Cl.
CPC .......... *H01L 23/473* (2013.01); *H01L 23/367* (2013.01); *H01L 23/3735* (2013.01); *H01L 24/17* (2013.01); *H05K 7/20254* (2013.01)

(58) Field of Classification Search
CPC . H01L 23/473; H01L 23/367; H01L 23/3735; H01L 24/17
See application file for complete search history.

(56) References Cited

U.S. PATENT DOCUMENTS

| | | | |
|---|---|---|---|
| 2017/0162475 A1* | 6/2017 | Frey | ...................... H01L 23/473 |
| 2019/0206764 A1* | 7/2019 | Kulkarni | ............. H01L 23/3675 |

* cited by examiner

*Primary Examiner* — Anthony Ho
(74) *Attorney, Agent, or Firm* — Schwabe, Williamson & Wyatt, P.C.

(57) ABSTRACT

Embodiments include semiconductor packages and cooling semiconductor packaging systems. A semiconductor package includes a second die on a package substrate, first dies on the second die, conductive bumps between the first dies and the second die, a cold plate and a manifold over the first dies, second die, and package substrate, and first openings in the manifold. The first openings are fluidly coupled through the conductive bumps. The semiconductor package may include a first fluid path through the first openings of the manifold, where a first fluid flows through the first fluid path. The semiconductor package may further include a second fluid path through second openings of the cold plate, where a second fluid flows through the second fluid path, and where the first and second fluids of the first and second fluid paths cool heat providing surfaces of the first dies, the second die, or the package substrate.

25 Claims, 8 Drawing Sheets

LIQUID COOLING THROUGH CONDUCTIVE INTERCONNECT

FIELD

Embodiments relate to packaging semiconductor devices. More particularly, the embodiments relate to semiconductor packages with conductive interconnects that are cooled with liquid coolants.

BACKGROUND

For the past several decades, the scaling of features in integrated circuits has been a driving force behind an ever-growing semiconductor industry. Scaling to smaller and smaller features enables increased densities of functional units on the limited real estate of semiconductor devices. However, as the scaling of integrated circuits keeps reducing, the necessity to optimize the scaled semiconductor devices (e.g., stacked dies on package substrates) have become increasingly significant.

For example, as server products keep scaling down and increasing in power, the server products and semiconductor devices keep increasing their heating demands. Existing technologies typically use a traditional cooling system which includes cooling the backside of the semiconductor devices. This existing technology, however, is not sufficient as server products keep increasing in power and reducing in real estate.

The existing packaging solution relies on using the die backside for the major cooling. A heat sink, an air cooling device, and/or a cold plate can generally be attached directly to the die backside of the device to provide cooling to the device. Another existing solution includes using an integrated heat spreader (IHS) to provide cooling to the semiconductor device. These cooling solutions, however, are not efficient when the device(s) has stacked dies. That is, the cooling of the top die may be more efficient and have lowered temperatures, while the cooling of the bottom die is not sufficient due to the increased thermal resistance of the die-to-die stacked interfaces of the dies of the devices.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1A:
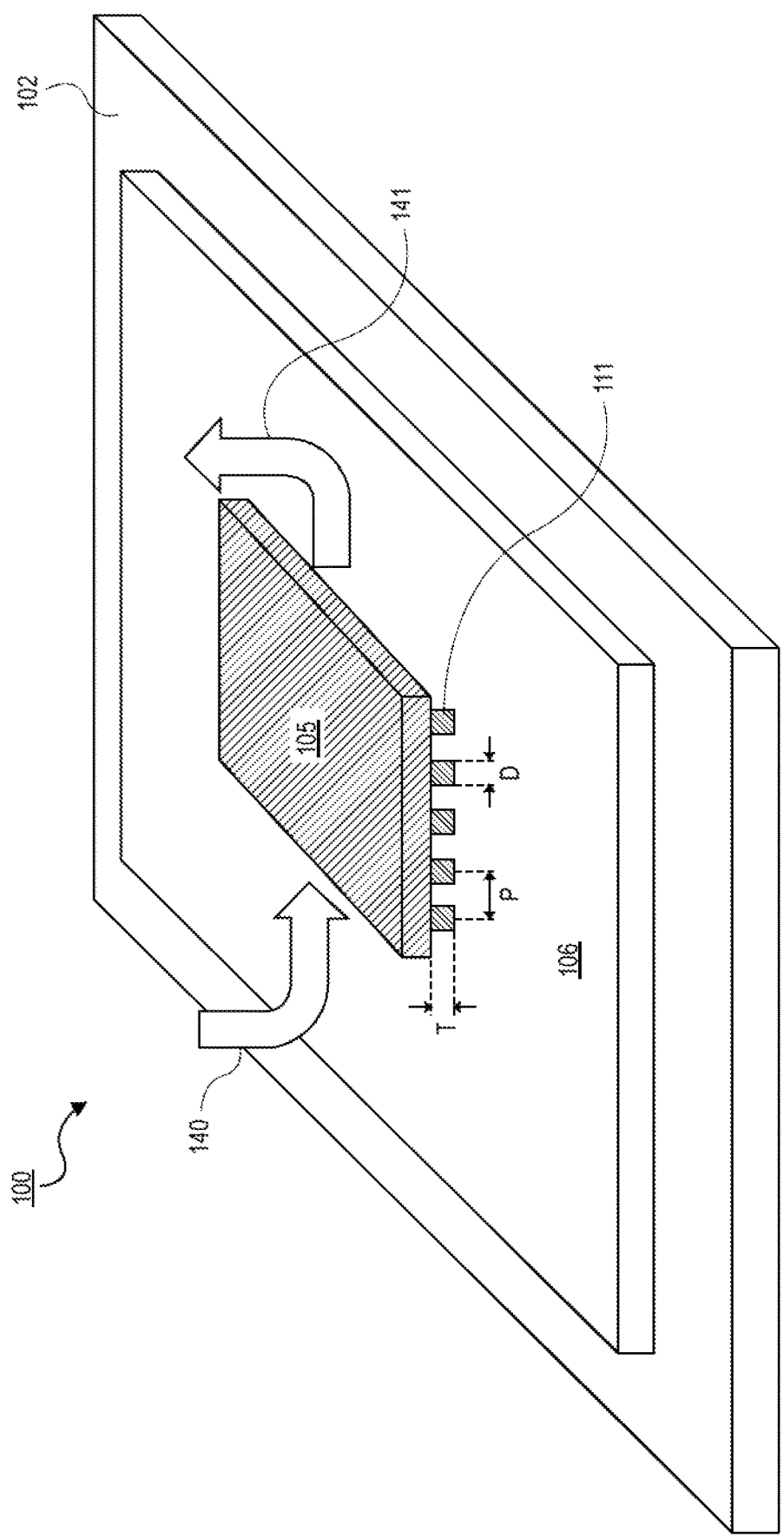
FIG. 1A is an illustration of a plan, perspective view of a semiconductor package having a package substrate with a first die over a second die, where the first die has a plurality of bumps that are cooled with a liquid cooling path, according to one embodiment.

Described herein are semiconductor packages with conductive interconnects (e.g., copper bumps or copper pillars) in between stacked dies, and cooling systems for such semiconductor packages to have cooling paths through the conductive interconnects of the stacked dies. As such, embodiments of the semiconductor packages described below enable cooling one or more stacked dies with one or more cooling paths that flowed through the conductive die interconnects in between the stacked dies. As described herein, the conductive interconnects (or conductive die interconnects) may refer to conductive bumps and/or conductive die pillars disposed between two electrical components (e.g., a die, a package substrate, an active component, etc.), where such interconnects may include one or more conductive materials, such as copper, silver, nickel, tin, aluminum, solders, metallic materials/alloys, or the like, according to some embodiments.

Embodiments described herein improve packaging solutions by providing one or more cooling paths—in addition to the existing cooling solution typically implemented on the backside of the top die(s)—for stacked dies (or a stack of dies) such that the total cooling capability may be the sum of the existing cooling solution plus the cooling through the copper bumps between the stacked dies. As described herein, the cooling solutions may be implemented to flow through and between one or more packaging configurations, including between stacked dies, between a die and a package substrate, between package substrates, and so on, according to some embodiments. In addition, the semiconductor packages described below enable a higher liquid flow rate that may lower both the overall temperature and the junction to liquid inlet thermal resistance, while also increasing the cooling capability.

Embodiments of the semiconductor packages also improve packaging solutions by having a stacked die configuration with two or more cooling paths that allow for substantially reducing the liquid pressure head, while also reducing the pump requirement as well as increasing the reliability of such packages. Additionally, the semiconductor packages described herein improve packaging solutions by optimizing the copper bump diameter of the stacked dies to enable flowing one or more cooling paths through the copper bumps to substantially increase the cooling capabilities of the semiconductor packages. Some other advantages of the embodiments described below include enabling different liquid types and separate liquid loops to be implemented on each of the cold plates and copper bumps of the semiconductor packages. For example, water (or anti-freezer) may be used in the liquid loop through the cold plate, while a fluorinated liquid may be used in a separate liquid loop through the copper bumps of the stacked dies. Some of the advantages of enabling different liquid loops includes (i) avoiding the mixing of water (or anti-freezer) and the fluorinated liquid, (ii) providing a flexibility to apply an ultra-fine-particle filter only to the loop used to cool the copper bumps to avoid particles to clog the flow between the bumps, and (iii) independently controlling the liquid flow rates and pressure heads in each of the loops of the semiconductor packages.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages having cold plates and manifolds over package substrates that have a plurality of first dies over a second die, where each of the first dies has a plurality of bumps that are cooled with a plurality of liquid cooling paths.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Figure 1B:
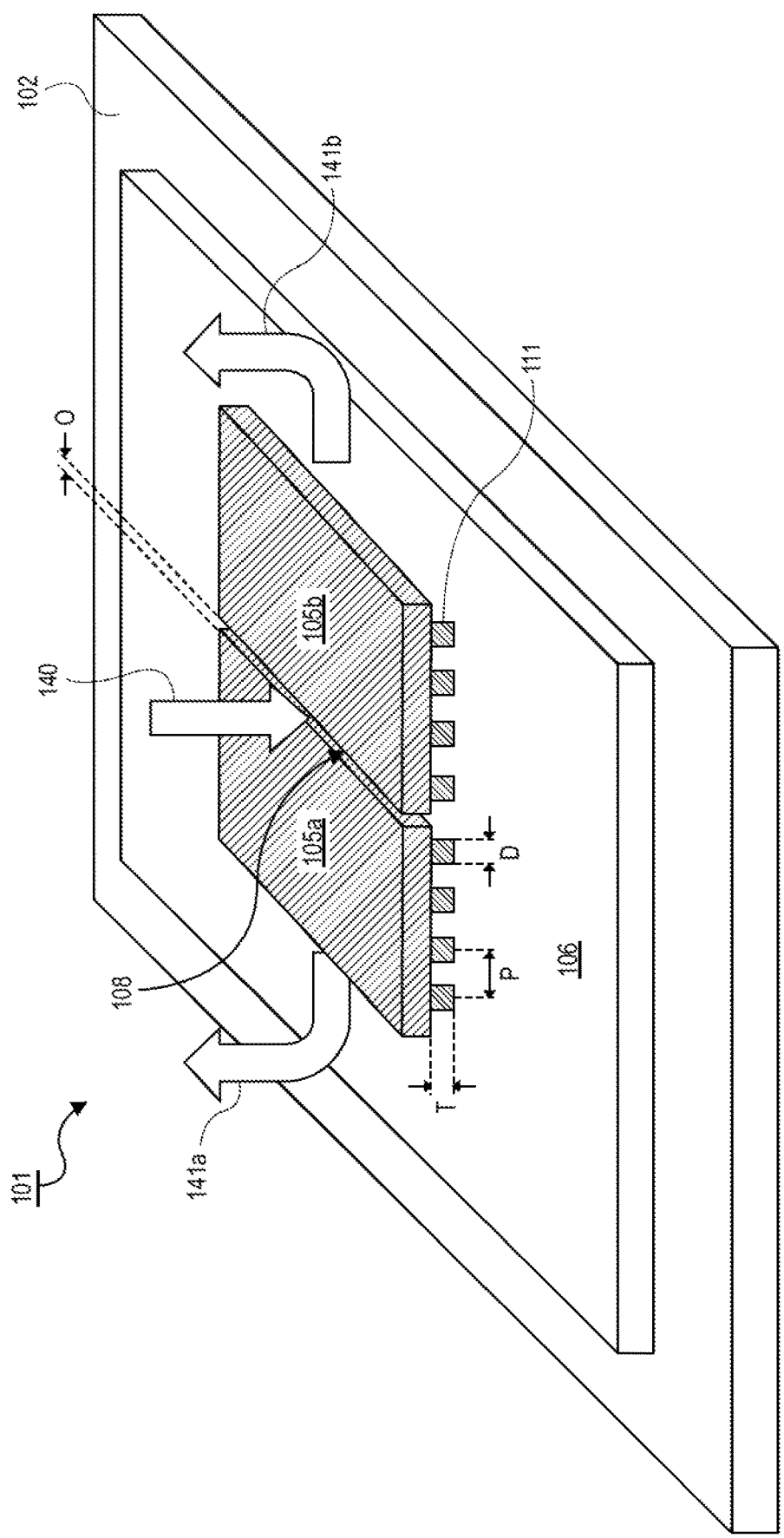
FIG. 1B is an illustration of a plan, perspective view of a semiconductor package having a package substrate with a plurality of first dies over a second die, where each of the first dies has a plurality of bumps that are cooled with a plurality of liquid cooling paths, according to one embodiment.

FIGS. 1A-1B are a series of plan illustrations that depict a plurality of semiconductor packages 100-101, where each semiconductor package 100-101 may have a package substrate 102 that includes one or more first dies 105 (or 105a-b) over a second die 106, in accordance with an embodiment. Each of the FIGS. 1A-1B illustrates one of the approaches that enables cooling the semiconductor packages 100-101 with one or more liquid cooling paths 140-141 (or 140-141a-b) flowed through copper bumps 111 that are disposed between the first dies 105 (or 105a-b) and the second die 106. Note that the semiconductor packages 100-101 only illustrate the dies 105-106, the conductive bumps 111, the package substrate 102, and the liquid cooling paths 140-141 to simplify the illustrations, but additional components may be included with the semiconductor packages (e.g., as shown with the semiconductor packages/systems 200-201, 300, and 400 of FIGS. 2-4).

Referring now to FIG. 1A, a plan illustration of a semiconductor package 100 is shown, in accordance with an embodiment. In an embodiment, the semiconductor package 100 may have a first die 105, a second die 106, and a package substrate 102. For example, as shown in FIG. 1A, the package substrate 102 may have the first die 105 stacked on the second die 106 with a plurality of bumps 111 disposed between the stacked dies 105-106. While the first and second stacked dies 105-106 are illustrated, it is to be appreciated that any number (or combination) of first dies 105 and second dies 106 may be stacked on the package substrate 102.

For one embodiment, the first die 105 may be stacked on the second die 106 with conductive bumps 111 (or copper bumps, pillars, or the like) disposed between the stacked dies 105-106. In one embodiment, the stacked dies 105-106 may be disposed on the package substrate 102. For one embodiment, the package substrate 102 may include, but is not limited to, a package, a substrate, a printed circuit board (PCB), and a motherboard. For one embodiment, the package substrate 102 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 102. For one embodiment, the PCB 102 may also include conductive layers that comprise conductive (or copper) traces, pads, vias, via pads, planes, and/or holes. Additionally, in some embodiments as shown below in FIGS. 2A-4, a cold plate, a manifold, and thermal interface material (TIM) layer(s) may be disposed over the top surface(s) of the stacked dies 105-106.

In an embodiment, the first and second dies 105-106 may be a microelectronic device, a semiconductor die, an integrated circuit (IC), a central processing unit (CPU), a microprocessor, a platform controller hub (PCH), a memory, and/or a field-programmable gate array (FPGA). In one embodiment, the first die 105 may be a top die, and the second die 106 may be a bottom die. In an alternate embodiment, the second die 106 may be a package substrate (e.g., the second die 106 may be a package substrate rather than being implemented as a bottom die). As described above, the conductive bumps 111 may be formed between the stack of first and second dies 105-106 (or the stacked first and second dies 105-106). As described herein, a "stack of dies" (or stacked dies) may refer to two or more dies that are stacked on top of each other. For example, even if not illustrated for simplicity, one or more dies may be stacked on top of the first die 105, where conductive bumps may also be formed between the one or more additional stacked dies.

As described in further detail below, the conductive bumps 111 may form a chamber that enables an opening between the first and second dies 105-106. In some embodiments, one or more liquid cooling paths 140-141 may be flowed (or pumped) through the chamber with one or more liquid coolants to cool the conductive bumps 111 between the dies 105-106. In an embodiment, the conductive bumps 111 may be a plurality of copper bumps, a plurality of copper pillars, and/or a plurality of copper die interconnects. Note that the conductive bumps 111 may be formed of one or more conductive materials, such as copper, silver, nickel, tin, aluminum, solders, metallic materials/alloys, and/or the like. In alternate embodiments, the conductive bumps 111 may have an insulated surface/layer that surrounds each of the conductive bumps 111, where the conductive bumps 111 may be surrounded with the insulated surface to enable a fluid, such as water, to flow through the conductive bumps 111 without conducting electricity.

As shown in FIG. 1A, the conductive bumps 111 may be formed to have one or more bump parameters, such as bump thickness ("T"), bump pitch ("P"), and bump diameter ("D"), which may optimize the cooling capabilities between the stacked dies 105-106. The bump thickness may refer to a thickness of the conductive bumps 111. The bump pitch may refer to a width between the centers of two adjacent conductive bumps 111. The bump diameter may refer to a diameter (or width) of the conductive bumps 111. In some embodiments, the conductive bumps 111 may have a bump thickness of approximately 70 um. In one embodiment, the conductive bumps 111 may have a bump thickness of approximately 70 um to 200 um. In some embodiments, the conductive bumps 111 may have a bump pitch of approximately 50 um. In one embodiment, the conductive bumps 111 may have a bump pitch of approximately 50 um or greater. In some embodiments, the conductive bumps 111 may have a bump diameter of approximately 65 um. In one embodiment, the conductive bumps 111 may have a bump diameter of approximately 20 um to 65 um.

For some embodiments, the liquid cooling path 140-141 may be a unidirectional flow. The unidirectional flow may have an input flow 140 and an output flow 141. In one embodiment, the input flow 140 may direct one or more fluids (or liquids) through the conductive bumps 111 between the stacked dies 105-106. The fluid may be pumped through the conductive bumps 111 that generate heat due to the stacked dies 105-106, as such the fluid flows through the conductive bumps 111 to cool the bumps 111 and the stacked dies 105-106. Accordingly, the output flow 141 may receive the fluid that may be heated (after being heated by the bumps 111 and dies 105-106) and then forward the fluid to a bump, a filter, and/or other cooling components before recirculating the fluid back to the input flow 140.

In one embodiment, the fluid/liquid flowing through the liquid cooling path 140-141 may be a non-electric-conductive, non-ionic, and non-reactive fluid (e.g., a fluorinated liquid). In another embodiment, the fluid may be water when the conductive bumps 111 are surrounded with an insulated material. For example, in some embodiments, the fluid may include a fluorinated coolant fluid (or a fluorinated type of liquid, a fluorinated liquid type, etc.) and/or a freon coolant fluid (or a freon coolant fluid type of liquid, a freon liquid type, etc.). As described herein, "freon" may refer to a commonly used fluid coolant, which may include any fluorocarbon refrigerants/coolants. In one embodiment, the fluorinated liquid type may include, but is not limited to, FC-3283, FC-40, FC-43, FC-72, FC-75, FC-78, and FC-88. In another embodiment, the freon liquid type may include, but is not limited to, freon-C-51-12, freon-E5, and freon-TF.

Note that the semiconductor package 100 may include fewer or additional packaging components based on the desired packaging design.

Referring now to FIG. 1B, a plan illustration of a semiconductor package 101 is shown, in accordance with an embodiment. The semiconductor package 101 may be substantially similar to the semiconductor package 100 described above in FIG. 1A, with the exception that a plurality of first dies 105a-b are stacked on the second die 106. For example, as shown in FIG. 1B, the package substrate 102 may have the first dies 105a-b stacked on the second die 106, where each of the first dies 105a-b has a plurality of bumps 111 disposed between the stacked dies 105a-106, and an opening 108 ("O") formed between the adjacently positioned first dies 105a-b. While the first and second stacked dies 105a-106 are illustrated, it is to be appreciated that any number (or combination) of first dies 105 and second dies 106 may be stacked on the package substrate 102. Similar to the semiconductor package above, conductive bumps 111 may be disposed between the first dies 105a-b and the second die 106.

For one embodiment, the first dies 105a-b may be stacked on the second die 106 with conductive bumps 111 disposed between the stacked dies 105a-b and 106. In one embodiment, the stacked dies 105a-106 may disposed on the package substrate 102. The package substrate 102 may be substantially similar to the package substrate 102 described above in FIG. 1A. Additionally, in some embodiments as shown below in FIGS. 2A-4, a cold plate, a manifold, and TIM layer(s) may be disposed over the top surface(s) of the stacked dies 105a-b and 106.

The first dies 105a-b and second die 106 may be substantially similar to the first die 105 and second die 106 described above in FIG. 1A. In one embodiment, the first dies 105a-b may be top dies, and the second die 106 may be a bottom die. Additionally, in one embodiment, the first dies 105a-b may be implemented (or configured) as die chiplets that are stacked on/over the second die 106. In an alternate embodiment, the second die 106 may be a package substrate. As described above, the conductive bumps 111 may be formed between the stack of first and second dies 105a-106. Note that, even if not illustrated for simplicity, one or more dies may be stacked on top of the first dies 105a-b, where conductive bumps may also be formed between the one or more additional stacked dies.

For one embodiment, the conductive bumps 111 may form one or more chambers that enable openings between the first and second dies 105a-106. Additionally, the first dies 105a-b may be positioned adjacent to each other, leaving an opening 108 between the first dies 105a-b. In some embodiments, one or more liquid cooling paths 140-141a-b may be flowed through the chambers with one or more liquid coolants to cool the conductive bumps 111 between the dies 105a-b and 106. In an embodiment, the conductive bumps 111 may be a plurality of copper bumps. The conductive bumps 111 may be formed of one or more conductive materials, such as copper, aluminum, tin, or the like. In alternate embodiments, the conductive bumps 111 may have an insulated surface/layer that surrounds each of the conductive bumps 111, where the conductive bumps 111 may be surrounded with the insulated surface to enable a fluid, such as water, to flow through the conductive bumps 111 without conducting electricity.

As shown in FIG. 1B, the conductive bumps 111 may be formed to have one or more bump parameters, such as bump thickness ("T"), bump pitch ("P"), and bump diameter ("D"), which may optimize the cooling capabilities between the stacked dies 105a-106. In some embodiments, the conductive bumps 111 may have a bump thickness of approximately 70 um. In one embodiment, the conductive bumps 111 may have a bump thickness of approximately 70 um to 200 um. In some embodiments, the conductive bumps 111 may have a bump pitch of approximately 100 um. In one embodiment, the conductive bumps 111 may have a bump pitch of approximately 100 um or greater. In some embodiments, the conductive bumps 111 may have a bump diameter of approximately 65 um. In one embodiment, the conductive bumps 111 may have a bump diameter of approximately 40 um to 65 um. In some embodiments, the opening 108 may have a width of approximately 1 mm or greater.

For some embodiments, the liquid cooling paths 140-141a-b may be two or more flows that are split in opposite directions. The flows may have an input flow 140 and two output flows 141a-b. In one embodiment, the input flow 140 may direct one or more fluids through the conductive bumps 111 between the stacked dies 105a-b and 106. The fluids may be pumped through the conductive bumps 111 below the first dies 105a-b to cool the accumulated (or generated) heat formed between the bumps 111 and the stacked dies 105a-106. Accordingly, the output flow 141a may receive the fluid pumped through the conductive bumps 111 between the first die 105a and second die 106, while the output flow 141b may receive the fluid pumped through the conductive bumps 111 between the first die 105b and the second die 106. In some embodiments, the output flows 141a-b may direct the fluids in opposite directions and then forward the fluids to bump, filters, and/or other cooling components before recirculating (and/or recombining) the fluids back to the input flow 140.

In one embodiment, the one or more fluids/liquids flowing through the liquid cooling path 140-141a-b may be a non-electric-conductive, non-ionic, and non-reactive fluid (e.g., a fluorinated liquid). In another embodiment, the one or more fluids may be water when the conductive bumps 111 are surrounded with an insulated material. For example, in some embodiments, the one or more fluids may include a fluorinated liquid type and/or a freon liquid type. In one embodiment, the fluorinated liquid type may include, but is not limited to, FC-3283, FC-40, FC-43, FC-72, FC-75, FC-78, and FC-88. In another embodiment, the freon liquid type may include, but is not limited to, freon-C-51-12, freon-E5, and freon-TF. Additionally, the liquid cooling paths 140-141a-b may have the same fluid pumped through both paths. However, in other embodiments, the liquid cooling paths 140-141a-b may have different fluids pumped through the two different paths, where each of the paths may be a separate loop with a different cooling configuration and/or a different cooling path. Note that the semiconductor package 101 may include fewer or additional packaging components based on the desired packaging design.

According to some embodiments, the semiconductor packages 100-101 of FIGS. 1A-1B may enable an improved cooling system that combines an external package cooling solution and an internal package cooling solution. The external package cooling solution includes a cold plate disposed over a semiconductor package (e.g., as shown with the cold plates 250 and 350 of FIGS. 2A-3). In some embodiments, the external package cooling solution may implement a liquid cooling path that flows through the cold plate and then through a pump and/or a filter that are connected to the cold plate. The liquid cooling path includes a fluid (e.g., water) that enters an input opening of the cold plate and then flows through a plurality of channels (or an internal tubing) within the cold plate, as the chilled fluid cools the semiconductor package from the outside. After the chilled fluid flows through the mini-channels of the cold plate, the chilled fluid absorbs heat from the package that is transferred away from the package through an output opening of the cold plate, where the fluid may then be forwarded to the pump and/or the filter before recirculating back to the input opening of the cold plate.

The internal package cooling solution includes a manifold (or a manifold body) disposed above the stacked dies of the semiconductor package (e.g., as shown with the manifolds 252, 352, and 452 of FIGS. 2A-4). In some embodiments, the internal package cooling solution may implement a liquid cooling path that flows through one or more loops of the manifold and then through a pump and/or a filter that are connected to the manifold. Note that, as described herein, one or more of these components such as the manifold, the cold plate, the pump, and/or the filter may be fluidly coupled with each other, where fluidly coupled may refer to one or more components that may be coupled with a fluid path, allowing a fluid to flow freely without leaks through such fluid path between the one or more components. The liquid cooling path includes a fluid (e.g., a fluorinated liquid) that enters an input opening of the manifold above the stacked dies, and then the fluid may be split into two separate loops as one of the paths flows through the conductive bumps of one of the top die, and another path flows through the conductive bumps of another of the top dies, thereby the fluid cools the semiconductor package from the inside as the fluid passes through the conductive bumps between the stacked dies and through the chambers within the manifold. After the fluid flows through the manifold and conductive bumps, the chilled fluid absorbs heat generated within the package that is transferred away from the package through one or more output openings of the manifold, where the fluid(s) may then be forwarded (in opposite directions) to the pump(s) and/or the filter(s) before recirculating back to the input opening of the manifold.

Figure 2A:
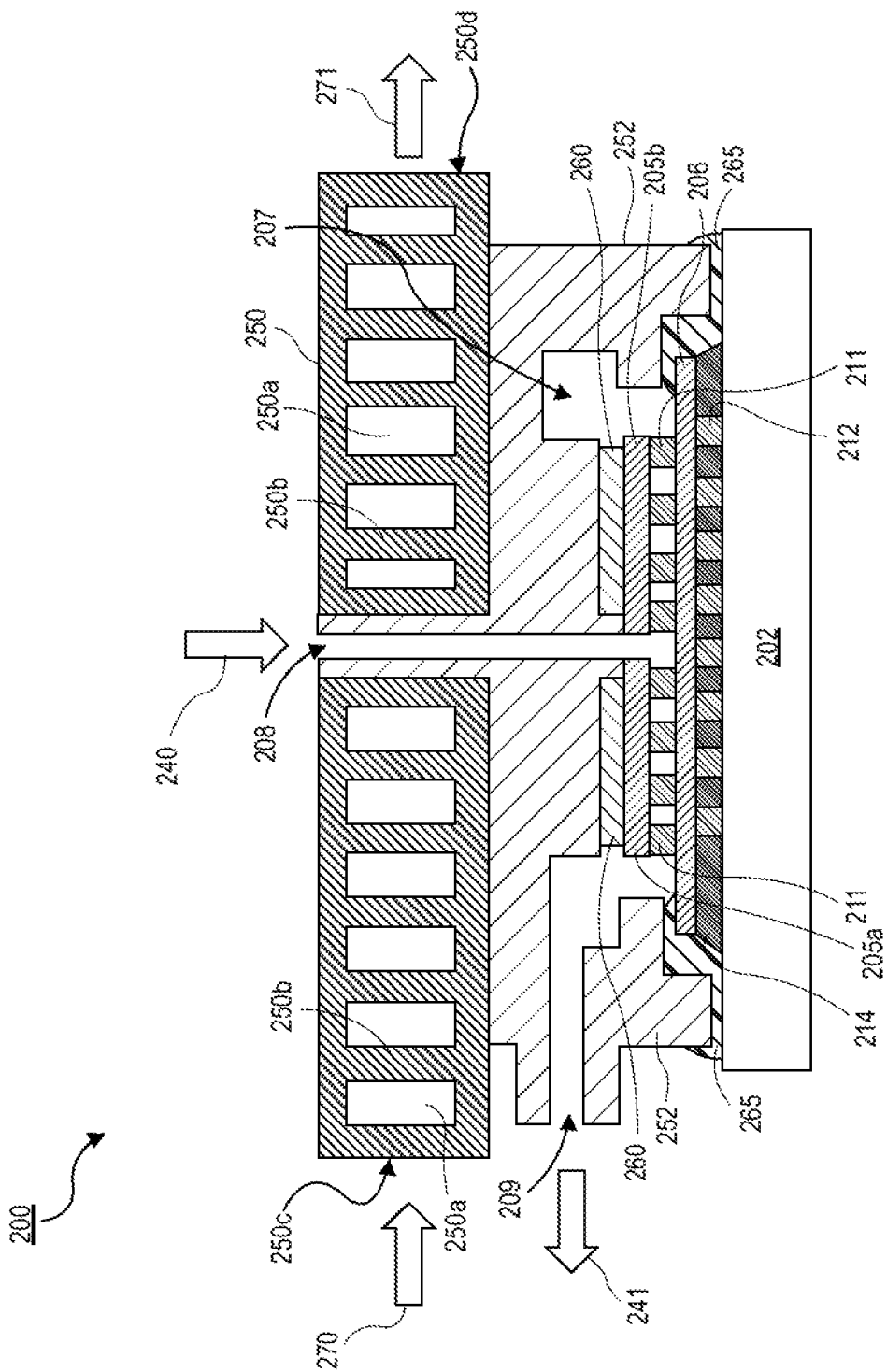
FIG. 2A is an illustration of a cross-sectional view of a semiconductor package having a cold plate and a manifold over a package substrate with a plurality of first dies over a second die, where each of the first dies has a plurality of bumps that are cooled with a plurality of liquid cooling paths, according to one embodiment.
Figure 2B:
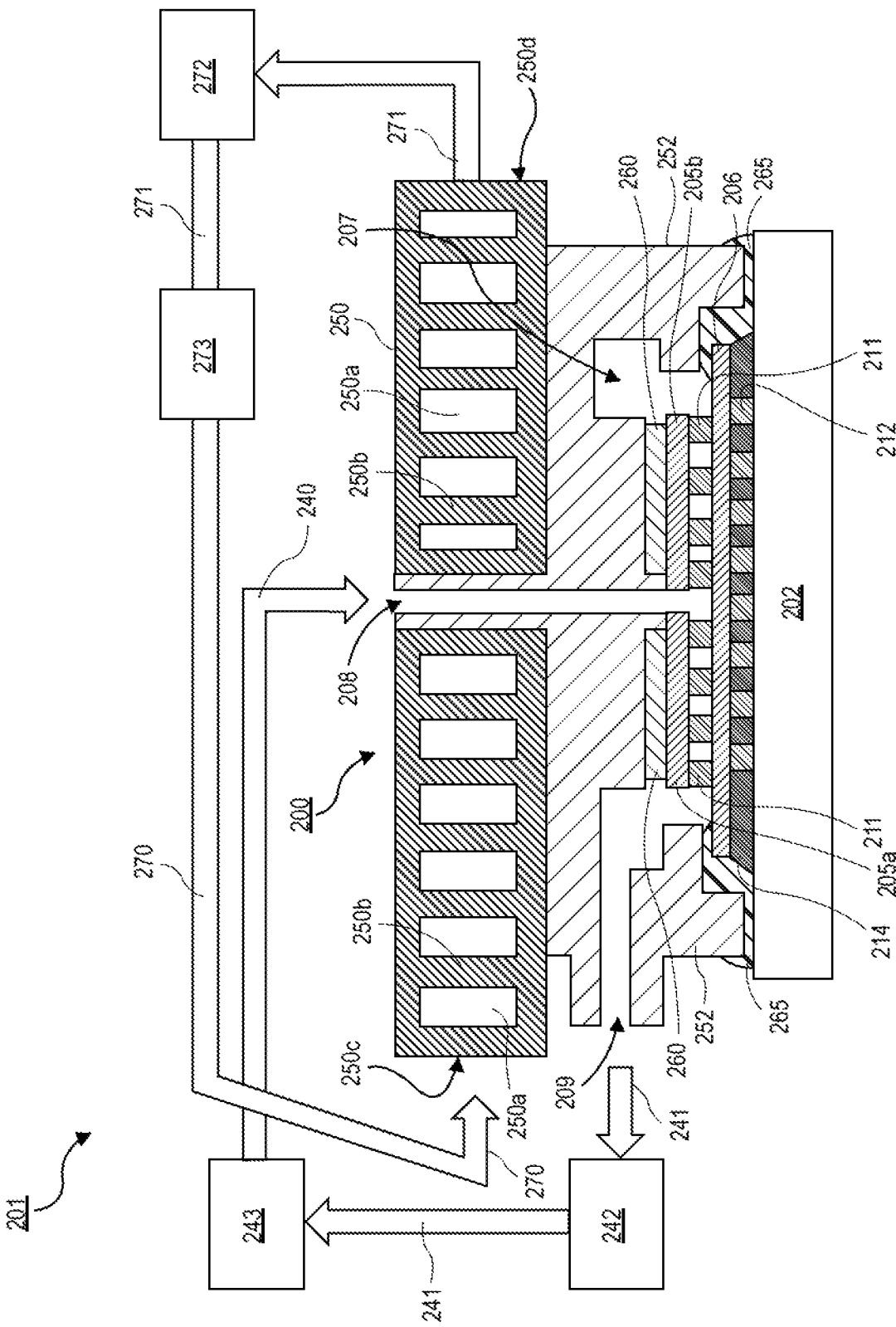
FIG. 2B is an illustration of a schematic block diagram illustrating a cooling semiconductor packaging system with a cross-sectional view of a semiconductor package having a cold plate and a manifold over a package substrate with a plurality of first dies over a second die, where each of the first dies has a plurality of bumps that are cooled with a plurality of liquid cooling paths, according to one embodiment.

FIGS. 2A-2B are a series of cross-sectional illustrations that depict a semiconductor package 200 as shown in FIGS. 2A-2B and a semiconductor packaging cooling system 201 as shown in FIG. 2B, in accordance with an embodiment. FIG. 2A illustrates one of the approaches that enables cooling a semiconductor package 200 with one or more liquid cooling paths 240-241 and 270-271 that are flowed through a cold plate 250 and a manifold 252, respectively. While FIG. 2B illustrates the semiconductor package 200 as shown in FIG. 2A incorporated into a cooling system 201 with the liquid paths 240-241 and 270-271 forwarded through pumps 242 and 272 and filters 243 and 273.

Referring now to FIG. 2A, a cross-sectional illustration of a semiconductor package 200 (also referred to as a semiconductor packaging system) is shown, in accordance with an embodiment. The semiconductor package 200 may be substantially similar to the semiconductor package 101 of FIG. 1B, with the exception that a cold plate 250, a manifold 252, and TIMs 260 are disposed over the stacked dies 205a-b and 206 and the package substrate 202. For example, a plurality of liquid cooling paths 240-241 and 270-271 may distributed through the cold plate 250, the manifold 252, and the conductive bumps 211 disposed between the stacked dies 205a-b and 206. While the first and second stacked dies 205a-b and 206 are illustrated, it is to be appreciated that any number (or combination) of first dies 205a-b and second dies 206 may be stacked on the package substrate 202. Similar to the semiconductor packages above, conductive bumps 211 may be disposed between the first dies 205a-b and the second die 206.

For one embodiment, the first dies 205a-b may be stacked on the second die 206 with conductive bumps 211 disposed between the stacked dies 205a-b and 206. In one embodiment, the stacked dies 205a-206 may disposed on the package substrate 202. In an embodiment, the second die 206 may be disposed on the package substrate 202, where the second die 206 may be coupled to the package substrate 202 with a plurality of solder balls 212 (or solder bumps). For one embodiment, an underfill material 214 may be disposed between the second die 206 and the package substrate 202, thereby surrounding the solder balls 212 coupling the second die 206 and the package substrate 202. The package substrate 202 may be substantially similar to the package substrate 102 described above in FIG. 1B. The first dies 205a-b and second die 206 may be substantially similar to the first dies 105a-b and second die 106 described above in FIG. 1B. As described above, the conductive bumps 211 may be formed between the stack of first and second dies 205a-206. Note that, even if not illustrated for simplicity, one or more dies may be stacked on top of the first dies 205a-b, where conductive bumps may also be formed between the one or more additional stacked dies.

In some embodiments, the cold plate 250 and the manifold 252 may be disposed over the stacked dies 205a-206 and the package substrate 202. The cold plate 250 may be disposed on the manifold 252. In one embodiment, the cold plate 250 and the manifold 252 may be two separate components (as illustrated), however the cold plate 250 and the manifold 252 may also be combined into a single component. In one embodiment, an opening 208 may be formed over the second die 206, where the opening 208 may be a vertical opening that extends from the top opening between the cold plate 250 and the manifold 252 down to the internal opening between the stacked dies 205a-206 that exposes the conductive bumps 211 between such dies 205a-206.

In one embodiment, the cold plate 250 may include a plurality of openings 250a, a plurality of channels 250b (or micro-channels), an inlet opening 250c, and an outlet opening 250d. In the embodiments described herein, the cold plate 250 may be implemented (or designed) to channel a liquid from (1) the inlet opening 250c to (2) the channels 250b (or micro-channels) inside of the cold plate 250, where the fluid may flow through the openings 250a and cool the channels 250b within the cold plate 250, and then to (3) the outlet opening 250d, where the fluid may be released from the cold plate 250 to one or more other liquid cooling components (e.g., a pump, a filter, a remote heat exchanger, a chiller, etc.) that may pump, filter, dissipate heat from, and chill the liquid before the liquid is recirculated back to the inlet opening 250c of the cold plate 250. For example, the liquid fluid path 270-271 may include an input flow 270 and an output flow 271. The input flow 270 may direct a liquid (e.g., chilled water or anti-freezer) into the inlet opening 250c of the cold plate 250, through the channels 250b of the cold plate 250 as the chilled fluid cools the semiconductor package 200, and away from the package 200 with the output flow 271 through the output opening 250d of the cold plate 250, where the liquid may then be forwarded to a pump and/or a filter (or other components) before recirculating back to the inlet opening 250c of the cold plate 250.

For some embodiments, the liquid (e.g., chilled water) flowing through the cold plate 250 may transfer the heat generated by the dies 205a-b and 206 onto the cold plate 250, which dissipates heat from the heated liquid into the ambient, or another separate liquid cooling component or system. In some embodiments, the cold plate 250 may be formed of any highly thermally conductive material, such as copper, aluminum, or the like. In one embodiment, the cold plate 250 may have a thickness of approximately 5 mm to 20 mm.

In one embodiment, the manifold 252 may be disposed over the stacked dies 205a-206 and the package substrate 202. For one embodiment, TIMs 260 may be disposed between the top dies 205a-b and the manifold 252 to reduce thermal resistance. For some embodiments, the TIMs 260 may be disposed on the dies 205a-b to thermally (and/or mechanically) couple the dies 205a-b to the manifold 252. In one embodiment, the TIMs 260 may include, but are not limited to, a polymer TIM (PTIM), an epoxy, a liquid phase sintering (LPS) paste, a solder paste, a solder TIM (STIM), and/or any other thermal interface material(s). For one embodiment, a thickness of the TIM 260 on the first die 205a may be substantially equal to a thickness of the TIM 260 on the first die 205b. Note that the TIMs 260 may need to be compatible with the applicable liquids described herein.

In one embodiment, a sealant 265 may be disposed between the manifold 252 and the package substrate 202, where the sealant 265 surrounds portions of the second die 206 and the underfill material 214. The sealant 265 is disposed between the manifold 252, the second die 206, and the package substrate 202 to avoid a liquid leak through the package substrate 202. In one embodiment, the sealant 265 may be an epoxy, a silicone, a polymer, a solder, or the like.

As shown in FIG. 2A, the manifold 252 may include the inlet opening 208, one or more chambers 207, and one or more outlet openings 209. In the embodiments described herein, the manifold 252 may be implemented (or designed) to channel a liquid from (1) the inlet opening 208 to (2) the chambers 207 (or cavities) inside of the manifold 252, where the fluid may flow through and cool the conductive bumps 211 between the top dies 205a-b and the bottom die 206, and then to (3) the outlet openings 209, where the fluid may be released from the manifold 252 to one or more other liquid cooling components (e.g., a pump, a filter, a remote heat exchanger, a chiller, etc.) that may pump, filter, dissipate heat from, and chill the liquid before the liquid is recirculated back to the inlet opening 208 of the manifold 252. Note that, based on the cross-sectional view of FIG. 2A, only one outlet opening 209 may be shown, but the manifold 252 may include two or more outlet openings 209, as the liquid path/loop may be enter the inlet/input opening 208 and then split in opposite directions towards the outlet openings 209, where the liquid flows in one direction through the stacked dies 205a and 206 to one of the outlet openings 209 and in another direction through the stacked dies 205b and 206 to another outlet opening 209.

For one embodiment, as described above, the thickness of the conductive bumps 211 (e.g., "T" as shown in FIG. 1B) may provide openings between the first dies 205a-b and the second die 206 that enable the liquid to flow between the stacked dies 205a-206. Additionally, the first dies 205a-b may be positioned adjacent to each other above the second die 206, leaving a gap between the adjacent outer edges of the second dies 205a-b for the opening 208 of the manifold 252. In some embodiments, a liquid cooling path 240-241 may be flowed through the chambers 207 of the manifold 252 with the liquid to cool the conductive bumps 211 between the dies 205a-b and 206. In an embodiment, the conductive bumps 211 may be a plurality of copper bumps. The conductive bumps 211 may be formed of one or more conductive materials, such as copper, aluminum, tin, or the like. In alternate embodiments, the conductive bumps 211 may have an insulated surface/layer that surrounds each of the conductive bumps 211, where the conductive bumps 211 may be surrounded with the insulated surface to enable a fluid, such as water, to flow through the conductive bumps 211 without conducting electricity.

As described above, the conductive bumps 211 may be formed to have one or more bump parameters, such as bump thickness, bump pitch, and bump diameter, which may optimize the cooling capabilities between the stacked dies 205a-206. In some embodiments, the conductive bumps 211 may have a bump thickness of approximately 70 um. In one embodiment, the conductive bumps 211 may have a bump thickness of approximately 70 um to 200 um. In some embodiments, the conductive bumps 211 may have a bump pitch of approximately 50 um. In one embodiment, the conductive bumps 211 may have a bump pitch of approximately 50 um or greater. In some embodiments, the conductive bumps 211 may have a bump diameter of approximately 65 um. In one embodiment, the conductive bumps 211 may have a bump diameter of approximately 20 um to 65 um. In some embodiments, the inlet opening 208 (or the input opening) of the manifold 252 may have a width of approximately 1 mm or greater.

For some embodiments, the liquid cooling paths 240-241 may include two or more flows that are split in opposite directions as described above. The liquid cooling paths 240-241 may be an input liquid flow 240 and one or more output flows 241. In one embodiment, the input flow 240 may direct the fluid through the conductive bumps 211 between the stacked dies 205a-b and 206. The fluid may be pumped through the conductive bumps 211 below the first dies 205a-b to cool the accumulated (or generated) heat formed between the bumps 211 and the stacked dies 205a-b and 206. Accordingly, one or more output flows 241 may receive the split fluid pumped through the conductive bumps 211 between the first die 205a and second die 206, and through the conductive bumps 211 between the first die 205b and the second die 206. In some embodiments, the output flows 241 may direct the fluid(s) in opposite directions and then forward the fluid(s) to pumps, filters, and/or other cooling components before recirculating (and/or recombining) the fluid(s) back to the input flow 240 (e.g., as illustrated below with the cooling system 201 of FIG. 2B).

As described herein, the liquid (e.g., a fluorinated liquid) may transfer heat from the dies 205a-b and 206 to the manifold 252 (and/or a remote heat exchanger) which dissipates heat from the heated liquid into the ambient, or another separate liquid cooling component or system. Continuing with the above example, the manifold 252 helps dissipate the heat from the semiconductor package 200 horizontally, while the cold plate 250 concurrently helps dissipate the heat from the semiconductor package 200 vertically. In one embodiment, the liquid flowing through the liquid cooling path 240-241 may be a non-electric-conductive, non-ionic, and non-reactive liquid (e.g., a fluorinated liquid). In another embodiment, the fluid may be water when the conductive bumps 111 are surrounded with an insulated material. In some embodiments, the liquid may be a fluorinated liquid type and/or a freon liquid type. In one embodiment, the fluorinated liquid type may include, but is not limited to, FC-3283, FC-40, FC-43, FC-72, FC-75, FC-78, and FC-88. In another embodiment, the freon liquid type may include, but is not limited to, freon-C-51-12, freon-E5, and freon-TF.

Additionally, the semiconductor package 200 may implement different liquid types and separate liquid loops for each of the cold plate 250 and the conductive bumps 211. For example, water may be used in the loop (i.e., the water loop) that passes through the cold plate 250, while a fluorinated liquid may be used in the loop (i.e., the fluorinated liquid loop) that passes through the conductive bumps 211. As such, the different liquid loops may (i) avoid mixing the water loop and the fluorinated liquid loop, (ii) provide a flexibility in the loops as to apply an ultra-fine-particle filter to only the fluorinated loop to avoid particles clogging the flow between the conductive bumps 211, and (iii) independently control the liquid flow rates and pressure heads in each of the different loops.

Note that the semiconductor package 200 may include fewer or additional packaging components based on the desired packaging design.

Referring now to FIG. 2B, a block diagram illustration of a semiconductor packaging system 201 with a cross-sectional illustration of a semiconductor package 200 is shown, in accordance with an embodiment. The semiconductor package 200 may be substantially similar to the semiconductor package 200 of FIG. 2A, with the exception that the semiconductor package 200 of FIG. 2B is incorporated into a liquid cooling system that includes pumps 242 and 272 and filters 243 and 273. For example, a first liquid path 240-241 passes through the manifold 252 of the semiconductor package 200 and then loops back through the pump 242 and the filter 243, while a second liquid path 270-271 passes through the cold plate 250 of the semiconductor package and then loops back through the pump 272 and the filter 273. While the pumps 242 and 272 and the filters 243 and 273 are illustrated, it is to be appreciated that any other cooling components may be incorporated into the system 201, and any number (or combination) of pumps 242 and 272 and filters 243 and 273 may be coupled with the semiconductor package 200. Similar to the semiconductor packages above, conductive bumps 211 may be disposed between the first dies 205a-b and the second die 206.

As described above, the semiconductor packaging system 201 may implement a liquid cooling system that combines a first liquid cooling path 240-241 for internal package cooling and a second liquid cooling path 270-271 for external package cooling, according to some embodiments. In one embodiment, the liquid cooling system 200 incorporates the pumps 242 and 272, the filters 243 and 273, the first and second liquid cooling paths 240-241 and 270-271, and the semiconductor package 200 to enable an additional cooling path 240-241 through the conductive bumps 211 of the package 200 in addition to a cooling path 270-271 through the cold plate 250 above the top surfaces of the first dies 205a-b, such that the total cooling capability of the system 200 may be the sum (or greater than the sum) of both the additional cooling path 240-241 and the cooling path 270-271.

In some embodiments, the first liquid cooling path 240-241 may circulate a fluorinated liquid (or a freon liquid) and thus may be referred to as a fluorinated liquid loop (or a fluorinated loop). The fluorinated liquid loop 240-241 may flow the fluorinated liquid through the manifold 252, the pump 242, and the filter 243, respectively, and then back through the manifold 252. In an embodiment, a first input flow 240 delivers the fluorinated liquid to the inlet opening 208 of the manifold 252 over the stacked dies 205a-206. After the fluorinated liquid flows down (or through) the inlet opening 208, the fluorinated liquid may be split into separate loops as one loop flows through the conductive bumps 211 of the stacked dies 205a and 206, and another loop flows through the conductive bumps 211 of the stacked dies 205b and 206. Lastly, after the fluorinated liquid flows through the manifold 252 and the conductive bumps 211, a first output flow 241 (or first output flows) may receive the fluorinated liquid from the outlet opening 209 (or openings) of the manifold 252 and forward the fluorinated liquid to the pump 242 and the filter 243—prior to recirculating the fluorinated liquid back to the first input flow 240. In one embodiment, the pump 242 may be any type of liquid pump that may be pumped with fluorinated or freon liquid types, and also be adjusted and controlled for liquid flow rates, pressure, and so on. In one embodiment, the filter 243 may be an ultra-fine-particle filter that may filter substantially small particles that may flow through the conductive bumps 211, such that the ultra-fine-particle filter 243 may be incorporated into the system 201 to avoid any clogs between the manifold 252 and through the first liquid cooling path 240-241.

In some embodiments, the second liquid cooling path 270-271 may circulate a second liquid such as water (or the like) and thus may be referred to as a water loop. The water loop 270-271 may flow the water through the cold plate 250, the pump 272, and the filter 273, respectively, and then back through the cold plate 250. In an embodiment, a second input flow 270 delivers the water to the inlet opening 250c of the cold plate 250 over the manifold 252 and the stacked dies 205a-206. After the water flows through the inlet opening 250c, the water may be circulated through openings 250a within the cold plate 250 that are formed with channels 250b within the cold plate 250. Lastly, after the water flows through the cold plate 250, a second output flow 271 may receive the water from the outlet opening 250d of the cold plate 250 and forward the water to the pump 272 and the filter 273—prior to recirculating the water back to the second input flow 270. In one embodiment, the pump 272 may be any type of liquid pump that may be adjusted and controlled for liquid flow rates, pressure, and so on. In one embodiment, the filter 273 may be a fine-particle filter that may filter small particles that may flow through the openings 250a of the cold plate 250, such that the fine-particle filter 273 may be incorporated into the system 201 to avoid any clogs between the cold plate 250 and through the second liquid cooling path 270-271.

Note that the semiconductor packaging system 201 may include fewer or additional packaging components based on the desired packaging design.

Figure 3:
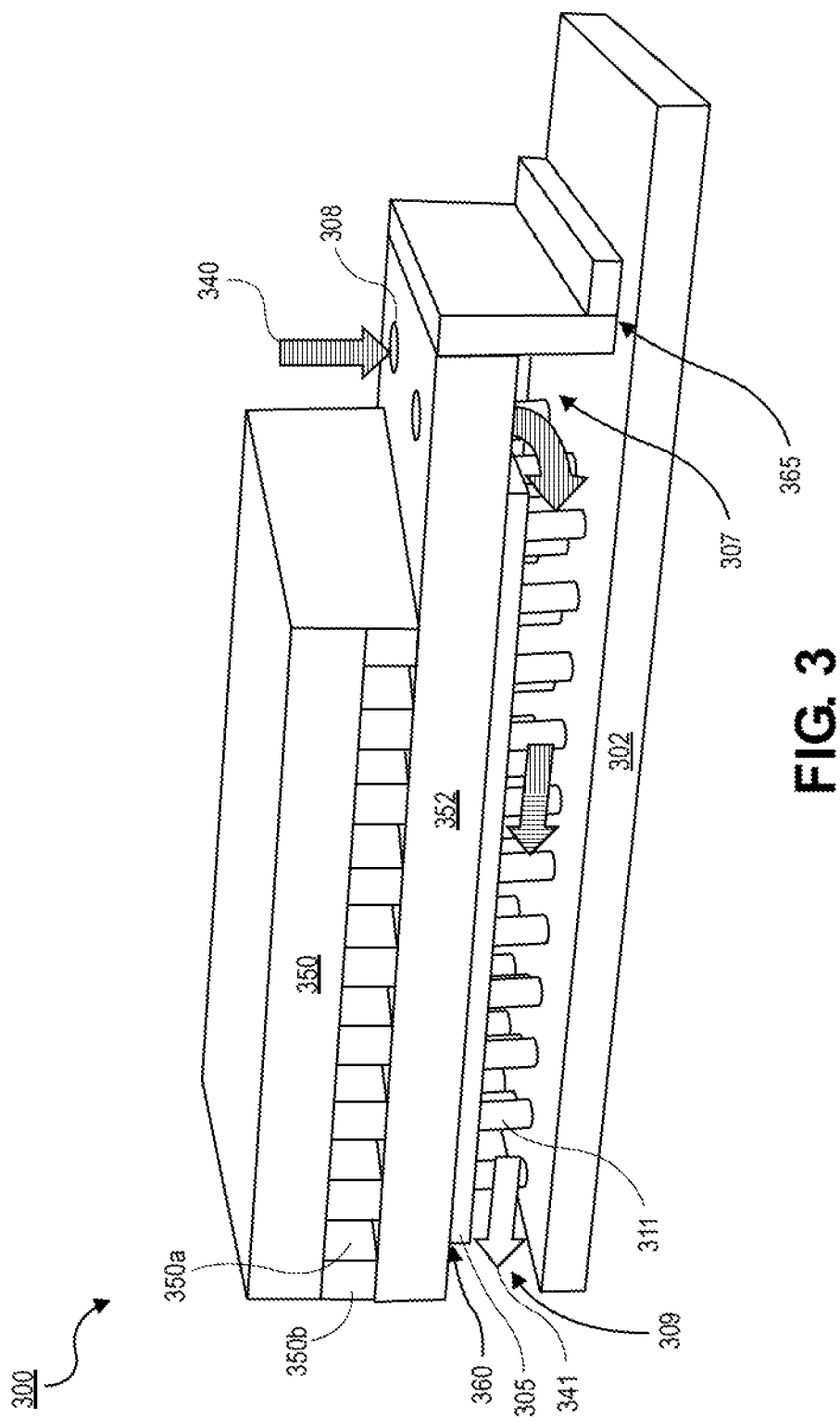
FIG. 3 is an illustration of a cross-sectional view of a semiconductor package having a cold plate and a manifold over a package substrate with a first die, where the first die has a plurality of bumps that are cooled with a liquid cooling path, according to one embodiment.

Referring now to FIG. 3, a cross-sectional illustration of a semiconductor package 300 (also referred to as a semiconductor packaging system) is shown, in accordance with an embodiment. The semiconductor package 300 may be substantially similar to the semiconductor package 100 of FIG. 1A, in particular with the semiconductor package 200 of FIG. 2A, with the exception that only one first die 305 is disposed on the second die 302. For example, unlike the two first dies 205a-b of FIG. 2A that are stacked over the second die 206 and the package substrate 202, embodiments of FIG. 3 illustrate only one first die 305 that is stacked over the second die 302, where the second die 302 may be a bottom die or a package substrate. As described above, while only the stack of dies 302 and 305 are illustrated, it is to be appreciated that any number (or combination) of first dies 305 and second dies 302 may be implemented with the semiconductor package 300. Similar to the semiconductor packages above, conductive bumps 311 may be disposed between the first die 305 and the second die 302.

For one embodiment, the first die 305 may be stacked on the second die 302 with conductive bumps 311 disposed between the stacked dies 302 and 305. In one embodiment, the stacked dies 302 and 305 may include a first die 305 stacked on a second die 302, where the stacked dies 302 and 305 are also disposed on a package substrate (e.g., as shown with the package substrate 102 of FIG. 1A). In another embodiment, the stack may include a first die 305 stacked on a package substrate 302, where the package substrate 302 is a PCB (or the like) and not a die. Accordingly, in these embodiments, the bottom die 302 may be a die or a package substrate. The first die 305 may be substantially similar to the first die 105 described above in FIG. 1B. When the second die 302 is a bottom die, the second die 302 may be substantially similar to the second die 106 described above in FIG. 1B. When the second die 302 is a package substrate, the package substrate 302 may be substantially similar to the package substrate 102 described above in FIG. 1B. Note that, even if not illustrated for simplicity, one or more dies may be stacked on top of the first die 305, where conductive bumps may also be formed between the one or more additional stacked dies.

In some embodiments, the cold plate 350 and the manifold 352 may be disposed over the stacked dies 302 and 305. The cold plate 350 may be disposed on the manifold 352. In one embodiment, the manifold 352 may be disposed over the first die 305 and coupled to the first die 305 with TIM(s) 360 in between the manifold 352 and the first die 305. In one embodiment, the manifold 352 may be disposed on and coupled to the second die 302 with a sealant 365. In one embodiment, the cold plate 350 and the manifold 352 may be two separate components (as illustrated), however the cold plate 350 and the manifold 352 may also be combined into a single component.

The cold plate 350 and the manifold 352 may be substantially similar to the cold plate 250 and the manifold 252 described above in FIG. 2A, with the exception that the manifold 352 may only include a unidirectional liquid cooling path 340-341 with only one loop (i.e., as compared to two or more loops as illustrated in FIGS. 2A-2B). In one embodiment, openings 308-309 may be formed through the manifold 352, where an inlet opening 308 may direct the liquid to a chamber 307 within the manifold 352 that exposes the conductive bumps 311 between the stacked dies 302 and 305, and then the liquid is flowed through the conductive bumps 311 between the first die 305 and the second die 302 towards an outlet opening 309. In one embodiment, the cold plate 350 may include a plurality of openings 350a and a plurality of channels 350b (or microchannels), which may also include an inlet opening and an outlet opening.

For one embodiment, as described above, the thickness of the conductive bumps 311 (e.g., "T" as shown in FIG. 1A) provides openings between the first die 305 and the second die 302 that enable the liquid to flow between the stacked dies 302 and 305. In some embodiments, a liquid cooling path 340-341 may be flowed through both the inlet opening 308 and the chamber 307 of the manifold 352 with the liquid to cool the conductive bumps 311 between the dies 302 and 305. In an embodiment, the conductive bumps 311 may be a plurality of copper bumps. The conductive bumps 311 may be formed of one or more conductive materials, such as copper, aluminum, tin, or the like. In alternate embodiments, the conductive bumps 311 may have an insulated surface/layer that surrounds each of the conductive bumps 311, where the conductive bumps 311 may be surrounded with the insulated surface to enable a fluid, such as water, to flow through the conductive bumps 311 without conducting electricity.

As described above, the conductive bumps 311 may be formed to have one or more bump parameters, such as bump thickness, bump pitch, and bump diameter, which may optimize the cooling capabilities between the stacked dies 302 and 305. In some embodiments, the conductive bumps 311 may have a bump thickness of approximately 70 um. In one embodiment, the conductive bumps 311 may have a bump thickness of approximately 70 um to 200 um. In some embodiments, the conductive bumps 311 may have a bump pitch of approximately 50 um. In one embodiment, the conductive bumps 311 may have a bump pitch of approximately 50 um or greater. In some embodiments, the conductive bumps 311 may have a bump diameter of approximately 65 um. In one embodiment, the conductive bumps 311 may have a bump diameter of approximately 20 um to 65 um.

In one embodiment, the liquid flowing through the liquid cooling path 340-341 may be a non-electric-conductive, non-ionic, and non-reactive liquid (e.g., a fluorinated liquid). In another embodiment, the fluid may be water when the conductive bumps 111 are surrounded with an insulated material. In some embodiments, the liquid may be a fluorinated liquid type and/or a freon liquid type. In one embodiment, the fluorinated liquid type may include, but is not limited to, FC-3283, FC-40, FC-43, FC-72, FC-75, FC-78, and FC-88. In another embodiment, the freon liquid type may include, but is not limited to, freon-C-51-12, freon-E5, and freon-TF.

Additionally, the semiconductor package 300 may implement different liquid types and separate liquid loops for each of the cold plate 350 and the conductive bumps 311. For example, water may be used in the loop (i.e., the water loop) that passes through the cold plate 350, while a fluorinated liquid may be used in the loop (i.e., the fluorinated liquid loop) that passes through the conductive bumps 311. As such, the different liquid loops may (i) avoid mixing the water loop and the fluorinated liquid loop, (ii) provide a flexibility in the loops as to apply an ultra-fine-particle filter to only the fluorinated loop to avoid particles clogging the flow between the conductive bumps 311, and (iii) independently control the liquid flow rates and pressure heads in each of the different loops.

Note that the semiconductor package 300 may include fewer or additional packaging components based on the desired packaging design.

Figure 4:
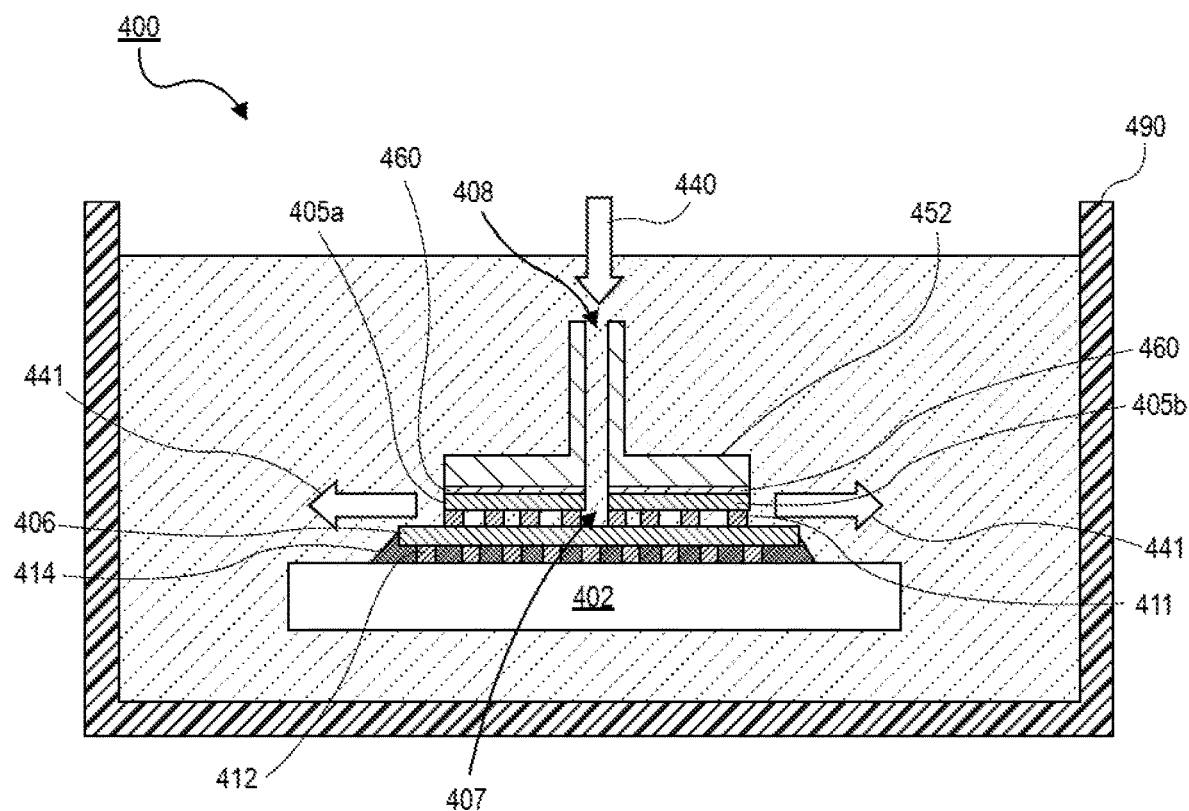
FIG. 4 is an illustration of a cross-sectional view of a semiconductor packaging system having an integrated heat spreader over a package substrate with a plurality of first dies over a second die, where each of the first dies has a plurality of bumps that are cooled with a plurality of liquid cooling paths in an immersion tank, according to one embodiment.

Referring now to FIG. 4, a cross-sectional illustration of a semiconductor package system 400 is shown, in accordance with an embodiment. The semiconductor package system 400 may be substantially similar to the semiconductor package 200 of FIG. 2A, with the exception that a chamber 490 surrounds the stacked dies 405a-406 and the package substrate 402. For example, the stacked dies 405a-406, the package substrate 402, and the manifold 452 (or an IHS) may be submerged (or immersed) in the liquid that is contained by the chamber 490. While the first dies 405a-b and the second die 406 are illustrated, it is to be appreciated that any number (or combination) of first dies 405a-b and second dies 406 may be stacked on the package substrate 402. Similar to the semiconductor packages above, conductive bumps 411 may be disposed between the first dies 405a-b and the second die 406.

For one embodiment, the first dies 405a-b may be stacked on the second die 406 with conductive bumps 411 disposed between the stacked dies 405a-406. The stacked dies 405a-406 may be disposed on the package substrate 402. In an embodiment, the second die 406 may be disposed on the package substrate 402, where the second die 406 may be coupled to the package substrate 402 with a plurality of solder balls 412 (or solder bumps). For one embodiment, an underfill material 414 may be disposed between the second die 406 and the package substrate 402, thereby surrounding the solder balls 412 coupling the second die 406 and the package substrate 402. The package substrate 402 may be substantially similar to the package substrate 202 described above in FIG. 2A. The first dies 405a-b and second die 406 may be substantially similar to the first dies 205a-b and second die 206 described above in FIG. 2A. As described above, the conductive bumps 411 may be formed between the stack of first and second dies 405a-406. Note that, even if not illustrated for simplicity, one or more dies may be stacked on top of the first dies 405a-b, where conductive bumps may also be formed between the one or more additional stacked dies.

In some embodiments, the manifold 452 may be disposed over the stacked dies 405a-406 and the package substrate 402. In one embodiment, TIMs 460 may be disposed between the top dies 405a-b and the manifold 452 to reduce thermal resistance. For some embodiments, the TIMs 460 may be disposed on the dies 405a-b to thermally (and/or mechanically) couple the dies 405a-b to the manifold 452. In one embodiment, the manifold 452 may be a heat spreader or the like. For one embodiment, the heat spreader 452 may extend beyond the width of the top dies 405a-b to achieve more effective immersion cooling. The manifold 452 may be similar to the manifold 252 described above in FIG. 2A, with the exception that the manifold 452 may be designed to be completely immersed in liquid contained by the chamber 490. In one embodiment, the chamber 490 may be an immersion tank or the like. The immersion tank 490 may be used to hold the liquid that flows through the liquid cooling path 440-441. For example, the semiconductor package 400 may implement the chamber 490 as the external package cooling combined with the conductive bumps 411 as the internal package cooling.

In one embodiment, an opening 408 may be formed over the second die 406, where the opening 408 may be a vertical opening that extends from the top opening between the manifold 452 down to the internal opening between the stacked dies 405a-406 that exposes the conductive bumps 411 between such dies 405a-406. For some embodiments, the liquid flowing through the manifold 452 and the conductive bumps 411 may transfer the heat generated by the dies 405*a-b* and 406 onto the ambient fluid held in the chamber 490. Note that the TIMs 460 may need to be compatible with the applicable liquids described herein.

As shown in FIG. 4, the manifold 452 may include the inlet opening 408 and the chamber 407. In some embodiments, the manifold 452 may be implemented (or designed) to channel a liquid from (1) the inlet opening 408 to (2) the chamber 407 (or cavity) inside of the manifold 452, where the liquid may flow through and cool the conductive bumps 411 between the top dies 405*a-b* and the bottom die 406, and then split towards (3) the outer openings between the stacked dies 405*a*-406, where the liquid may be released from the manifold 452 into the immersion tank 490 before the liquid is recirculated back to the inlet opening 408 of the manifold 452.

For one embodiment, as described above, the thickness of the conductive bumps 411 (e.g., "T" as shown in FIG. 1B) may provide openings between the first dies 405*a-b* and the second die 406 that enable the liquid to flow between the stacked dies 405*a*-406. In an embodiment, the conductive bumps 411 may be a plurality of copper bumps. The conductive bumps 411 may be formed of one or more conductive materials, such as copper, aluminum, tin, or the like. In alternate embodiments, the conductive bumps 411 may have an insulated surface/layer that surrounds each of the conductive bumps 411, where the conductive bumps 411 may be surrounded with the insulated surface to enable a fluid, such as water, to flow through the conductive bumps 411 without conducting electricity.

As described above, the conductive bumps 411 may be formed to have one or more bump parameters, such as bump thickness, bump pitch, and bump diameter, which may optimize the cooling capabilities between the stacked dies 405*a*-406. In some embodiments, the conductive bumps 411 may have a bump thickness of approximately 70 um. In one embodiment, the conductive bumps 411 may have a bump thickness of approximately 70 um to 200 um. In some embodiments, the conductive bumps 411 may have a bump pitch of approximately 100 um. In one embodiment, the conductive bumps 411 may have a bump pitch of approximately 100 um or greater. In some embodiments, the conductive bumps 411 may have a bump diameter of approximately 65 um. In one embodiment, the conductive bumps 411 may have a bump diameter of approximately 40 um to 65 um. In some embodiments, the inlet opening 408 (or the input opening) of the manifold 452 may have a width of approximately 1 mm or greater.

As shown in FIG. 4, in some embodiments, the liquid in the chamber 490 may be shared for the immersion cooling and the conductive bump cooling. In addition, in one embodiment, a dedicated pump (e.g., as shown with the pump 242 of FIG. 2B) may be used to provide a forced flow of liquid 440-441 through the conductive bumps 411. The exit of the heated liquid may then be released to the immersion tank 490 since the same liquid is shared. In one embodiment, a dedicated pump and an ultra-fine-particle filter (e.g., as shown with the pump 242 and the ultra-fine-particle filter 243 of FIG. 2B) may be implemented to provide a clean liquid with sufficient pressure head to flow through the conductive bumps 411. For some embodiments, the total cooling capability may thus be the sum of the system-level immersion cooling enabled with the immersion tank 490 plus the liquid cooling path 440-441 that enables the liquid to flow through the conductive bumps 411 between the stacked dies 405*a*-406.

In one embodiment, the liquid flowing through the liquid cooling path 440-441 and in the chamber 490 may be a non-electric-conductive, non-ionic, and non-reactive liquid (e.g., a fluorinated liquid). In another embodiment, the liquid may be water when the conductive bumps 411 and other components are surrounded with an insulated (or encapsulated) material. In some embodiments, the liquid may be a fluorinated liquid type and/or a freon liquid type. In one embodiment, the fluorinated liquid type may include, but is not limited to, FC-3283, FC-40, FC-43, FC-72, FC-75, FC-78, and FC-88. In another embodiment, the freon liquid type may include, but is not limited to, freon-C-51-12, freon-E5, and freon-TF.

Note that the semiconductor packaging system 400 may include fewer or additional packaging components based on the desired packaging design.

Figure 5:
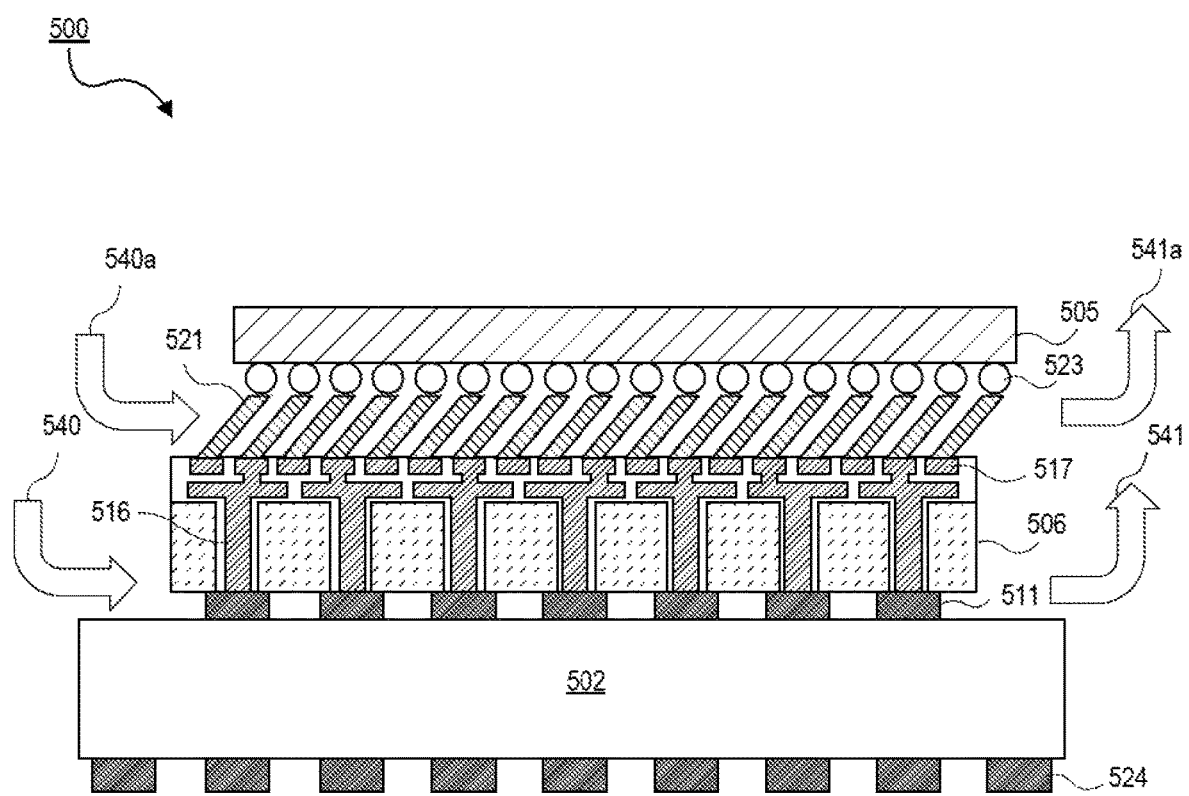
FIG. 5 is an illustration of a cross-sectional view of a semiconductor package having a first die and a second die over a package substrate, where the first die and the second die are coupled with a plurality of angled pillars, and including one or more liquid cooling paths, according to one embodiment.

Referring now to FIG. 5, a cross-sectional illustration of a semiconductor package 500 (also referred to as a semiconductor packaging system) is shown, in accordance with an embodiment. The semiconductor package 500 may be similar to the semiconductor packages 100 and 300 of FIGS. 1A and 3, with the exception that a plurality of angled pillars 521 couples the first and second dies 505-506, and a liquid cooling path 540-541 may pass through a plurality of conductive bumps 511 disposed between the second die 506 and the package substrate 502 and/or a liquid cooling path 540*a*-541*a* may pass through the plurality of angled/tilted pillars 521 disposed between the first and second dies 505-506. For example, the semiconductor packages above enable liquid to pass between stacked dies, while the semiconductor package 500 (*i*) enables liquid to pass between the bottom die 506 and the package substrate 502, and (ii) implements angled pillars 521 to improve (or overcome) existing thermomechanical issues typically associated with vertical pillars. Additionally, while the first die 505 and the second die 506 are illustrated, it is to be appreciated that any number (or combination) of first dies 505 and second dies 506 may be stacked on the package substrate 502. Similar to the semiconductor packages above, conductive bumps 511 may be disposed—but rather than between the stacked dies 505-506—between the second die 506 and the package substrate 502.

In one embodiment, the first die 505 may be stacked on the second die 506 with angled pillars 521 disposed between the stacked dies 505-506. The stacked dies 505-506 may be disposed on the package substrate 502. In an embodiment, the second die 506 may be disposed on the package substrate 502, where the second die 506 may be coupled to the package substrate 502 with conductive bumps 511. The package substrate 502 may be substantially similar to the package substrate 102 described above in FIG. 1A. The first die 505 and second die 506 may be substantially similar to the first die 105 and second die 106 described above in FIG. 1A. In one embodiment, as shown in FIG. 5, the second die 506 may include conductive pads 517 (e.g., first level interconnects) and interconnects 516 (e.g., through silicon vias (TSVs)), where the interconnects 516 may enable coupling the top die 505 through the TSVs 516 of the bottom die 506 to the package substrate 502. Additionally, the conductive bumps 511 may be substantially similar to the conductive bumps 111 described above in FIG. 1A. The package substrate 502 may have a plurality of conductive bumps 524 that may be used to couple to another substrate. In one embodiment, the conductive bumps 524 may also be substantially similar to the conductive bumps 111 described above in FIG. 1A. Note that, even if not illustrated for simplicity, one or more dies may be stacked on top of the first die 505, where conductive bumps may also be formed between the one or more additional stacked dies. Additionally, as shown above in FIGS. 2A-4, a cold plate, a manifold, and thermal interface material (TIM) layer(s) may be disposed over the top surface(s) of the stacked dies 505-506.

As shown in FIG. 5, the angled pillars 521 couple pads 517 of the second die 506 to solder balls 523 of the first die 505. Note that, in other embodiments, the pillars 521 may be vertical pillars (even if not illustrated) rather than angled/tilted pillars based on the desired packaging design/application. In one embodiment, the angled pillars 521 may be a plurality of angled conductive (e.g., cooper) pillars. The angled pillars 521 may be formed of one or more conductive materials, such as copper, aluminum, tin, or the like. In one embodiment, the angled pillars 521 may have a thickness (or z-height) that is greater than a thickness of the conductive bumps 511. For some embodiments, the angled conductive pillars 521 may be used to overcome thermomechanical challenges typically associated with straight vertical pillars. For example, the angled conductive pillars 521 may act as a spring (or the like) between the stacked dies 505-506 to provide a cushion-type of support between the dies 505-506, which reduces the stresses on the semiconductor package 500 (i.e., the angled conductive pillars 521 may act, for example, as shock absorbers used in a vehicle or the like). Additionally, since the conductive pillars 521 are angled, an offset may exist between the footprint of the bottom die 506 and the footprint of the top die 505, where an outer edge of the top die 505 (e.g., the right sidewall/edge of the top die 505) may extend past an outer edge of the bottom die 506 (e.g., the respective right sidewall/edge of the bottom die 506).

The conductive bumps 511 may be formed to have one or more bump parameters, such as bump thickness, bump pitch, and bump diameter, which may optimize the cooling capabilities between the bottom die 506 and the package substrate 502 and the stacked dies 505-506. In some embodiments, the conductive bumps 511 may have a bump thickness of approximately 70 um. In one embodiment, the conductive bumps 511 may have a bump thickness of approximately 70 um to 200 um. In some embodiments, the conductive bumps 511 may have a bump pitch of approximately 50 um. In one embodiment, the conductive bumps 511 may have a bump pitch of approximately 50 um or greater. In some embodiments, the conductive bumps 511 may have a bump diameter of approximately 65 um. In one embodiment, the conductive bumps 511 may have a bump diameter of approximately 20 um to 65 um.

For some embodiments, the liquid cooling path 540-541 may be a unidirectional flow. The unidirectional flow may have an input flow 540 and an output flow 541. In one embodiment, the input flow 540 may direct one or more fluids (or liquids) through the conductive bumps 511 between the stacked bottom die and package substrate 506 and 502. In additional embodiments, a liquid cooling path 540a-541a may also flow through the angled pillars 521 between the stacked dies 505-506. Note that, according to one embodiment, the liquid cooling path(s) 540-541 and 540a-541a may include one or more flows that pass between the bottom die 506 and the package substrate 502 and/or between the top and bottom dies 505-506—and, if both flows are implemented, the flows may occur substantially simultaneously or at different time intervals based on the desired packaging application/design. The fluid may be pumped through the conductive bumps 511 to cool the bumps 511, the stacked dies 505-506, and the package substrate 502. Accordingly, the output flow 541 may receive the fluid that may be heated (after being heated by the bumps 511, the dies 505-506, and the package substrate 502) and then forward the fluid to a pump, a filter, and/or other cooling components before recirculating the fluid back to the input flow 540 and 540a.

In one embodiment, the fluid/liquid flowing through the liquid cooling path 540-541 may be a non-electric-conductive, non-ionic, and non-reactive fluid (e.g., a fluorinated liquid). In another embodiment, the fluid may be water when the conductive bumps 511 are surrounded with an insulated material. For example, in some embodiments, the fluid may include a fluorinated type of liquid (or a fluorinated liquid type) and/or a freon type of liquid (or a freon liquid type). In one embodiment, the fluorinated liquid type may include, but is not limited to, FC-3283, FC-40, FC-43, FC-72, FC-75, FC-78, and FC-88. In another embodiment, the freon liquid type may include, but is not limited to, freon-C-51-12, freon-E5, and freon-TF.

Note that the semiconductor package 500 may include fewer or additional packaging components based on the desired packaging design.

Figure 6:
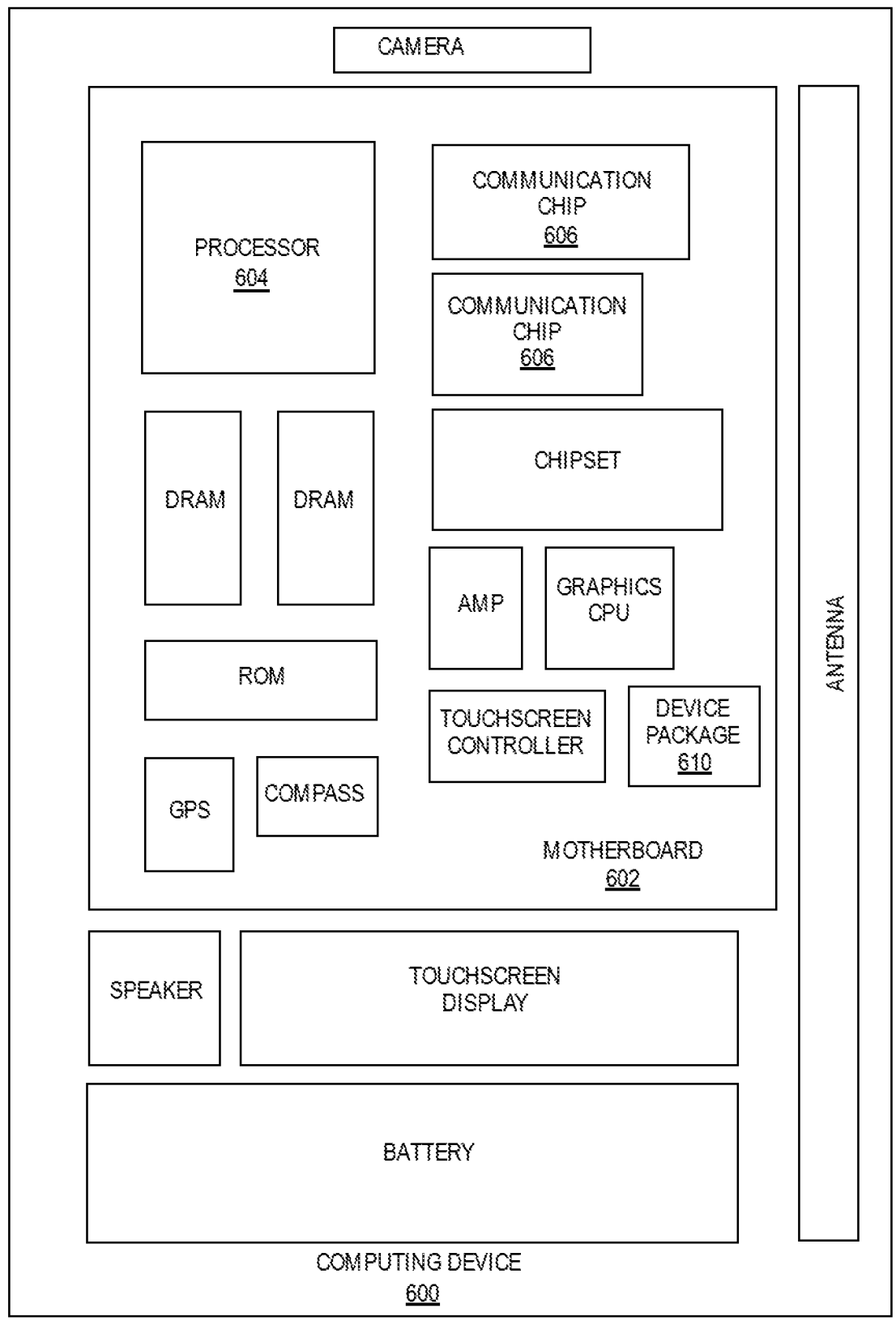
FIG. 6 is an illustration of a schematic block diagram illustrating a computer system that utilizes a device package having a cold plate and a manifold over a package substrate with a plurality of first dies over a second die, where each of the first dies has a plurality of bumps that are cooled with a plurality of liquid cooling paths, according to one embodiment.

FIG. 6 is an illustration of a schematic block diagram illustrating a computer system 600 that utilizes a device package 610 with a plurality of conductive bumps between stacked dies that enables one or more liquid cooling paths to circulate and cool the package 610 and the system 600, according to some embodiments. FIG. 6 illustrates an example of computing device 600.

Computing device 600 houses motherboard 602. Motherboard 602 may include a number of components, including but not limited to processor 604, device package 610 (or semiconductor package), and at least one communication chip 606. Processor 604 is physically and electrically coupled to motherboard 602. For some embodiments, at least one communication chip 606 is also physically and electrically coupled to motherboard 602. For other embodiments, at least one communication chip 606 is part of processor 604.

Depending on its applications, computing device 600 may include other components that may or may not be physically and electrically coupled to motherboard 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 606 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

Processor 604 of computing device 600 includes an integrated circuit die packaged within processor 604. Device package 610 may be, but is not limited to, a substrate, a package substrate, and/or a PCB. Device package 610 may be a semiconductor package having a package substrate with a plurality of conductive bumps between stacked dies that enables one or more liquid cooling paths to circulate and cool the package 610 and the system 600 (e.g., as illustrated in FIGS. 1A-5)—or any other components from the figures described herein. The device package 610 of the computing device 600 may be implemented with the semiconductor packaging liquid cooling system as described herein.

Note that device package 610 may be a single component/device, a subset of components, and/or an entire system, as the materials, features, and components may be limited to device package 610 and/or any other component of the computing device 600 that may need the conductive bumps and liquid cooling paths (e.g., the motherboard 602, the processor 604, and/or any other component of the computing device 600 that may need the semiconductor packages (or components/structures) as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 606 also includes an integrated circuit die packaged within the communication chip 606. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a semiconductor package, comprising: a second die on a package substrate; a plurality of first dies on the second die; a plurality of conductive bumps between the plurality of first dies and the second die; a cold plate and a manifold over the plurality of first dies, the second die, and the package substrate, wherein the cold plate is on the manifold; and a plurality of first openings in the manifold, wherein the plurality of first openings are fluidly coupled through the plurality of conductive bumps.

In example 2, the subject matter of example 1 can optionally include that the plurality of conductive bumps couple the plurality of first dies to the second die.

In example 3, the subject matter of examples 1-2 can optionally include a plurality of second openings in the cold plate; a plurality of thermal interface materials (TIMs) on the plurality of first dies, wherein the TIMs couple the manifold to the plurality of first dies; an underfill material between the second die and the package substrate; and a sealant surrounding the manifold, the package substrate, the underfill material, and the second die.

In example 4, the subject matter of examples 1-3 can optionally include that the plurality of first openings of the manifold include a first inlet opening and a plurality of first outlet openings, wherein the first inlet opening extends from a top surface of the manifold to a chamber in the manifold, wherein the chamber of the manifold exposes the plurality of conductive bumps between the plurality of first dies and the second die, and wherein the first inlet opening is fluidly coupled with the plurality of first outlet openings through the plurality of conductive bumps.

In example 5, the subject matter of examples 1-4 can optionally include that the cold plate has a plurality of channels, wherein the plurality of channels have a plurality of openings within the cold plate, wherein the plurality of second openings of the cold plate include a second inlet opening and a second outlet opening, and wherein the second inlet opening is fluidly coupled with the second outlet opening through the plurality of channels within the cold plate.

In example 6, the subject matter of examples 1-5 can optionally include a first fluid path through the plurality of first openings of the manifold, wherein a first fluid flows through the first fluid path; and a second fluid path through the plurality of second openings of the cold plate, wherein a second fluid flows through the second fluid path, wherein the first and second fluids of the first and second fluid paths cool one or more heat providing surfaces of the plurality of first dies, the second die, or the package substrate.

In example 7, the subject matter of examples 1-6 can optionally include that the first fluid includes a fluorinated coolant fluid or a freon coolant fluid, and wherein the second fluid includes water.

In example 8, the subject matter of examples 1-7 can optionally include that the first fluid path supplies the first fluid to the first inlet opening of the manifold, wherein the first fluid path passes the first fluid through the first inlet opening of the manifold to the chamber of the manifold, wherein the first fluid path passes the first fluid from the chamber of the manifold through the plurality of conductive bumps to the plurality of first outlet openings of the manifold, wherein the first fluid path splits the first fluid into two opposite directions through the plurality of conductive bumps towards the plurality of first outlet openings located on opposite ends of the manifold, wherein the first fluid path circulates the first fluid from the first inlet opening through the plurality of first outlet openings, and wherein the first fluid path subsequently recirculates the first fluid from the plurality of first outlet openings back to the first inlet opening.

In example 9, the subject matter of examples 1-6 can optionally include that the second fluid path supplies the second fluid to the second inlet opening of the cold plate, wherein the second fluid path passes the second fluid from the second inlet opening of the cold plate through the plurality of channels of the cold plate, wherein the second fluid path passes the second fluid from the plurality of channels of the cold plate to the second outlet opening of the cold plate, wherein the second fluid path circulates the second fluid from the second inlet opening through the second outlet openings second, and wherein the second fluid path subsequently recirculates the second fluid from the second outlet opening back to the second inlet opening.

In example 10, the subject matter of examples 1-9 can optionally include that the plurality of conductive bumps have a bump thickness, a bump diameter, and a bump pitch, wherein the bump thickness is approximately 70 um to 200 um, wherein the bump pitch is approximately 50 um or greater, wherein the bump diameter is approximately 20 um to 65 um, wherein the manifold is a heat spreader, wherein the second die has a width that is greater than a width of each of the plurality of first dies, and wherein the manifold is fluidly coupled to a pump, a filter, or an immersion tank.

Example 11 is a semiconductor package, comprising: a second die on a package substrate; a first die on the second die; a plurality of conductive bumps between the first die and the second die; a cold plate and a manifold over the first die, the second die, and the package substrate, wherein the cold plate is on the manifold; and a plurality of first openings in the manifold, wherein the plurality of first openings are fluidly coupled through the plurality of conductive bumps.

In example 12, the subject matter of example 11 can optionally include that the plurality of conductive bumps couple the first die to the second die.

In example 13, the subject matter of examples 11-12 can optionally include a plurality of second openings in the cold plate; a TIM on the first die, wherein the TIM couples the manifold to the first die; an underfill material between the second die and the package substrate; and a sealant surrounding the manifold, the package substrate, the underfill material, and the second die.

In example 14, the subject matter of examples 11-13 can optionally include that the plurality of first openings of the manifold include a first inlet opening and a first outlet opening, wherein the first inlet opening of the manifold exposes a chamber in the manifold, wherein the chamber of the manifold exposes the plurality of conductive bumps between the first die and the second die, and wherein the first inlet opening is fluidly coupled with the first outlet opening through the plurality of conductive bumps.

In example 15, the subject matter of examples 11-14 can optionally include that the cold plate has a plurality of channels, wherein the plurality of channels have a plurality of openings within the cold plate, wherein the plurality of second openings of the cold plate include a second inlet opening and a second outlet opening, and wherein the second inlet opening is fluidly coupled with the second outlet opening through the plurality of channels within the cold plate.

In example 16, the subject matter of examples 11-15 can optionally include a first fluid path through the plurality of first openings of the manifold, wherein a first fluid flows through the first fluid path; and a second fluid path through the plurality of second openings of the cold plate, wherein a second fluid flows through the second fluid path, wherein the first and second fluids of the first and second fluid paths cool one or more heat providing surfaces of the first die, the second die, or the package substrate.

In example 17, the subject matter of examples 11-16 can optionally include that first fluid includes a fluorinated coolant fluid or a freon coolant fluid, and wherein the second fluid includes water.

In example 18, the subject matter of examples 11-17 can optionally include that the first fluid path supplies the first fluid to the first inlet opening of the manifold, wherein the first fluid path passes the first fluid through the first inlet opening of the manifold to the chamber of the manifold, wherein the first fluid path passes the first fluid from the chamber of the manifold through the plurality of conductive bumps to the first outlet opening of the manifold, wherein the first fluid path passes the first fluid in one direction through the plurality of conductive bumps towards the first outlet opening of the manifold, wherein the first fluid path circulates the first fluid from the first inlet opening through the first outlet opening, and wherein the first fluid path subsequently recirculates the first fluid from the first outlet opening back to the first inlet opening.

In example 19, the subject matter of examples 11-18 can optionally include that the second fluid path supplies the second fluid to the second inlet opening of the cold plate, wherein the second fluid path passes the second fluid from the second inlet opening of the cold plate through the plurality of channels of the cold plate, wherein the second fluid path passes the second fluid from the plurality of channels of the cold plate to the second outlet opening of the cold plate, wherein the second fluid path circulates the second fluid from the second inlet opening through the second outlet openings second, and wherein the second fluid path subsequently recirculates the second fluid from the second outlet opening back to the second inlet opening.

In example 20, the subject matter of examples 11-19 can optionally include that the plurality of conductive bumps have a bump thickness, a bump diameter, and a bump pitch, wherein the bump thickness is approximately 70 um to 200 um, wherein the bump pitch is approximately 50 um or greater, wherein the bump diameter is approximately 20 um to 65 um, wherein the manifold is a heat spreader, wherein the second die has a width that is greater than a width of the first die, and wherein the manifold is fluidly coupled to a pump, a filter, or an immersion tank.

Example 21 is a semiconductor package, comprising: a second die on a package substrate; a plurality of conductive bumps between the second die and the package substrate, wherein the plurality of conductive bumps couple the second die to the package substrate; a first die on the second die; a plurality of angled conductive pillars between the first die and the second die, wherein the plurality of angled conductive pillars couple the first die to the second die; a cold plate and a manifold over the first die, the second die, and the package substrate, wherein the cold plate is on the manifold; and a plurality of first openings in the manifold, wherein the plurality of first openings are fluidly coupled through the plurality of conductive bumps.

In example 22, the subject matter of example 21 can optionally include a plurality of second openings in the cold plate; a TIM on the first die, wherein the TIM couples the manifold to the first die; and a sealant surrounding the manifold and the package substrate, wherein the plurality of first openings of the manifold include a first inlet opening and a first outlet opening, wherein the first inlet opening of the manifold exposes a chamber in the manifold, wherein the chamber of the manifold exposes the plurality of conductive bumps between the second die and the package substrate, wherein the first inlet opening is fluidly coupled with the first outlet opening through the plurality of conductive bumps, wherein the cold plate has a plurality of channels, wherein the plurality of channels have a plurality of openings within the cold plate, wherein the plurality of second openings of the cold plate include a second inlet opening and a second outlet opening, and wherein the second inlet opening is fluidly coupled with the second outlet opening through the plurality of channels within the cold plate.

In example 23, the subject matter of examples 21-22 can optionally include a first fluid path through the plurality of first openings of the manifold, wherein a first fluid flows through the first fluid path, wherein first fluid includes a fluorinated coolant fluid or a freon coolant fluid; and a second fluid path through the plurality of second openings of the cold plate, wherein a second fluid flows through the second fluid path, wherein the second fluid includes water, wherein the first and second fluids of the first and second fluid paths cool one or more heat providing surfaces of the first die, the second die, or the package substrate.

In example 24, the subject matter of examples 21-23 can optionally include that the first fluid path supplies the first fluid to the first inlet opening of the manifold, wherein the first fluid path passes the first fluid through the first inlet opening of the manifold to the chamber of the manifold, wherein the first fluid path passes the first fluid from the chamber of the manifold through the plurality of conductive bumps to the first outlet opening of the manifold, wherein the first fluid path passes the first fluid in one direction through the plurality of conductive bumps towards the first outlet opening of the manifold, wherein the first fluid path circulates the first fluid from the first inlet opening through the first outlet opening, and wherein the first fluid path subsequently recirculates the first fluid from the first outlet opening back to the first inlet opening, wherein the second fluid path supplies the second fluid to the second inlet opening of the cold plate, wherein the second fluid path passes the second fluid from the second inlet opening of the cold plate through the plurality of channels of the cold plate, wherein the second fluid path passes the second fluid from the plurality of channels of the cold plate to the second outlet opening of the cold plate, wherein the second fluid path circulates the second fluid from the second inlet opening through the second outlet openings second, and wherein the second fluid path subsequently recirculates the second fluid from the second outlet opening back to the second inlet opening.

In example 25, the subject matter of examples 21-24 can optionally include that the plurality of conductive bumps have a bump thickness, a bump diameter, and a bump pitch, wherein the bump thickness is approximately 70 um to 200 um, wherein the bump pitch is approximately 50 um or greater, wherein the bump diameter is approximately 20 um to 65 um, wherein the manifold is a heat spreader, wherein the second die has a width that is greater than a width of the first die, and wherein the manifold is fluidly coupled to a pump, a filter, or an immersion tank.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:
1. A semiconductor package, comprising:
   a second die on a package substrate;
   a plurality of first dies on the second die;
   a plurality of conductive bumps between the plurality of first dies and the second die;
   a cold plate and a manifold over the plurality of first dies, the second die, and the package substrate, wherein the cold plate is on the manifold; and
   a plurality of first openings in the manifold, wherein the plurality of first openings are fluidly coupled through the plurality of conductive bumps.

2. The semiconductor package of claim 1, wherein the plurality of conductive bumps couple the plurality of first dies to the second die.

3. The semiconductor package of claim 1, further comprising:
   a plurality of second openings in the cold plate;
   a plurality of thermal interface materials (TIMs) on the plurality of first dies, wherein the TIMs couple the manifold to the plurality of first dies;
   an underfill material between the second die and the package substrate; and
   a sealant surrounding the manifold, the package substrate, the underfill material, and the second die.

4. The semiconductor package of claim 3, wherein the plurality of first openings of the manifold include a first inlet opening and a plurality of first outlet openings, wherein the first inlet opening extends from a top surface of the manifold to a chamber in the manifold, wherein the chamber of the manifold exposes the plurality of conductive bumps between the plurality of first dies and the second die, and wherein the first inlet opening is fluidly coupled with the plurality of first outlet openings through the plurality of conductive bumps.

5. The semiconductor package of claim 4, wherein the cold plate has a plurality of channels, wherein the plurality of channels have a plurality of openings within the cold plate, wherein the plurality of second openings of the cold plate include a second inlet opening and a second outlet opening, and wherein the second inlet opening is fluidly coupled with the second outlet opening through the plurality of channels within the cold plate.

6. The semiconductor package of claim 5, further comprising:
   a first fluid path through the plurality of first openings of the manifold, wherein a first fluid flows through the first fluid path; and
   a second fluid path through the plurality of second openings of the cold plate, wherein a second fluid flows through the second fluid path, wherein the first and second fluids of the first and second fluid paths cool one or more heat providing surfaces of the plurality of first dies, the second die, or the package substrate.

7. The semiconductor package of claim 6, wherein first fluid includes a fluorinated coolant fluid or a freon coolant fluid, and wherein the second fluid includes water.

8. The semiconductor package of claim 6, wherein the first fluid path supplies the first fluid to the first inlet opening of the manifold, wherein the first fluid path passes the first fluid through the first inlet opening of the manifold to the chamber of the manifold, wherein the first fluid path passes the first fluid from the chamber of the manifold through the plurality of conductive bumps to the plurality of first outlet openings of the manifold, wherein the first fluid path splits the first fluid into two opposite directions through the plurality of conductive bumps towards the plurality of first outlet openings located on opposite ends of the manifold, wherein the first fluid path circulates the first fluid from the first inlet opening through the plurality of first outlet openings, and wherein the first fluid path subsequently recirculates the first fluid from the plurality of first outlet openings back to the first inlet opening.

9. The semiconductor package of claim 6, wherein the second fluid path supplies the second fluid to the second inlet opening of the cold plate, wherein the second fluid path passes the second fluid from the second inlet opening of the cold plate through the plurality of channels of the cold plate, wherein the second fluid path passes the second fluid from the plurality of channels of the cold plate to the second outlet opening of the cold plate, wherein the second fluid path circulates the second fluid from the second inlet opening through the second outlet openings second, and wherein the second fluid path subsequently recirculates the second fluid from the second outlet opening back to the second inlet opening.

10. The semiconductor package of claim 6, wherein the plurality of conductive bumps have a bump thickness, a bump diameter, and a bump pitch, wherein the bump thickness is approximately 70 um to 200 um, wherein the bump pitch is approximately 50 um or greater, wherein the bump diameter is approximately 20 um to 65 um, wherein the manifold is a heat spreader, wherein the second die has a width that is greater than a width of each of the plurality of first dies, and wherein the manifold is fluidly coupled to a pump, a filter, or an immersion tank.

11. A semiconductor package, comprising:
a second die on a package substrate;
a first die on the second die;
a plurality of conductive bumps between the first die and the second die;
a cold plate and a manifold over the first die, the second die, and the package substrate, wherein the cold plate is on the manifold; and
a plurality of first openings in the manifold, wherein the plurality of first openings are fluidly coupled through the plurality of conductive bumps.

12. The semiconductor package of claim 11, wherein the plurality of conductive bumps couple the first die to the second die.

13. The semiconductor package of claim 11, further comprising:
a plurality of second openings in the cold plate;
a TIM on the first die, wherein the TIM couples the manifold to the first die;
an underfill material between the second die and the package substrate; and
a sealant surrounding the manifold, the package substrate, the underfill material, and the second die.

14. The semiconductor package of claim 13, wherein the plurality of first openings of the manifold include a first inlet opening and a first outlet opening, wherein the first inlet opening of the manifold exposes a chamber in the manifold, wherein the chamber of the manifold exposes the plurality of conductive bumps between the first die and the second die, and wherein the first inlet opening is fluidly coupled with the first outlet opening through the plurality of conductive bumps.

15. The semiconductor package of claim 14, wherein the cold plate has a plurality of channels, wherein the plurality of channels have a plurality of openings within the cold plate, wherein the plurality of second openings of the cold plate include a second inlet opening and a second outlet opening, and wherein the second inlet opening is fluidly coupled with the second outlet opening through the plurality of channels within the cold plate.

16. The semiconductor package of claim 15, further comprising:
a first fluid path through the plurality of first openings of the manifold, wherein a first fluid flows through the first fluid path; and
a second fluid path through the plurality of second openings of the cold plate, wherein a second fluid flows through the second fluid path, wherein the first and second fluids of the first and second fluid paths cool one or more heat providing surfaces of the first die, the second die, or the package substrate.

17. The semiconductor package of claim 16, wherein first fluid includes a fluorinated coolant fluid or a freon coolant fluid, and wherein the second fluid includes water.

18. The semiconductor package of claim 16, wherein the first fluid path supplies the first fluid to the first inlet opening of the manifold, wherein the first fluid path passes the first fluid through the first inlet opening of the manifold to the chamber of the manifold, wherein the first fluid path passes the first fluid from the chamber of the manifold through the plurality of conductive bumps to the first outlet opening of the manifold, wherein the first fluid path passes the first fluid in one direction through the plurality of conductive bumps towards the first outlet opening of the manifold, wherein the first fluid path circulates the first fluid from the first inlet opening through the first outlet opening, and wherein the first fluid path subsequently recirculates the first fluid from the first outlet opening back to the first inlet opening.

19. The semiconductor package of claim 16, wherein the second fluid path supplies the second fluid to the second inlet opening of the cold plate, wherein the second fluid path passes the second fluid from the second inlet opening of the cold plate through the plurality of channels of the cold plate, wherein the second fluid path passes the second fluid from the plurality of channels of the cold plate to the second outlet opening of the cold plate, wherein the second fluid path circulates the second fluid from the second inlet opening through the second outlet openings second, and wherein the second fluid path subsequently recirculates the second fluid from the second outlet opening back to the second inlet opening.

20. The semiconductor package of claim 11, wherein the plurality of conductive bumps have a bump thickness, a bump diameter, and a bump pitch, wherein the bump thickness is approximately 70 um to 200 um, wherein the bump pitch is approximately 50 um or greater, wherein the bump diameter is approximately 20 um to 65 um, wherein the manifold is a heat spreader, wherein the second die has a width that is greater than a width of the first die, and wherein the manifold is fluidly coupled to a pump, a filter, or an immersion tank.

21. A semiconductor package, comprising:
a second die on a package substrate;
a plurality of conductive bumps between the second die and the package substrate, wherein the plurality of conductive bumps couple the second die to the package substrate;
a first die on the second die;
a plurality of angled conductive pillars between the first die and the second die, wherein the plurality of angled conductive pillars couple the first die to the second die;
a cold plate and a manifold over the first die, the second die, and the package substrate, wherein the cold plate is on the manifold; and
a plurality of first openings in the manifold, wherein the plurality of first openings are fluidly coupled through the plurality of conductive bumps.

22. The semiconductor package of claim 21, further comprising:
a plurality of second openings in the cold plate;
a TIM on the first die, wherein the TIM couples the manifold to the first die; and
a sealant surrounding the manifold and the package substrate, wherein the plurality of first openings of the manifold include a first inlet opening and a first outlet opening, wherein the first inlet opening of the manifold exposes a chamber in the manifold, wherein the chamber of the manifold exposes the plurality of conductive bumps between the second die and the package substrate, wherein the first inlet opening is fluidly coupled with the first outlet opening through the plurality of conductive bumps, wherein the cold plate has a plurality of channels, wherein the plurality of channels have a plurality of openings within the cold plate, wherein the plurality of second openings of the cold plate include a second inlet opening and a second outlet opening, and wherein the second inlet opening is fluidly coupled with the second outlet opening through the plurality of channels within the cold plate.

23. The semiconductor package of claim 22, further comprising:
a first fluid path through the plurality of first openings of the manifold, wherein a first fluid flows through the first fluid path, wherein first fluid includes a fluorinated coolant fluid or a freon coolant fluid; and
a second fluid path through the plurality of second openings of the cold plate, wherein a second fluid flows through the second fluid path, wherein the second fluid includes water, wherein the first and second fluids of the first and second fluid paths cool one or more heat providing surfaces of the first die, the second die, or the package substrate.

24. The semiconductor package of claim 23, wherein the first fluid path supplies the first fluid to the first inlet opening of the manifold, wherein the first fluid path passes the first fluid through the first inlet opening of the manifold to the chamber of the manifold, wherein the first fluid path passes the first fluid from the chamber of the manifold through the plurality of conductive bumps to the first outlet opening of the manifold, wherein the first fluid path passes the first fluid in one direction through the plurality of conductive bumps towards the first outlet opening of the manifold, wherein the first fluid path circulates the first fluid from the first inlet opening through the first outlet opening, and wherein the first fluid path subsequently recirculates the first fluid from the first outlet opening back to the first inlet opening, wherein the second fluid path supplies the second fluid to the second inlet opening of the cold plate, wherein the second fluid path passes the second fluid from the second inlet opening of the cold plate through the plurality of channels of the cold plate, wherein the second fluid path passes the second fluid from the plurality of channels of the cold plate to the second outlet opening of the cold plate, wherein the second fluid path circulates the second fluid from the second inlet opening through the second outlet openings second, and wherein the second fluid path subsequently recirculates the second fluid from the second outlet opening back to the second inlet opening.

25. The semiconductor package of claim 21, wherein the plurality of conductive bumps have a bump thickness, a bump diameter, and a bump pitch, wherein the bump thickness is approximately 70 um to 200 um, wherein the bump pitch is approximately 50 um or greater, wherein the bump diameter is approximately 20 um to 65 um, wherein the manifold is a heat spreader, wherein the second die has a width that is greater than a width of the first die, and wherein the manifold is fluidly coupled to a pump, a filter, or an immersion tank.

\* \* \* \* \*